US012243753B2

(12) United States Patent
Nakatani et al.

(10) Patent No.: US 12,243,753 B2
(45) Date of Patent: Mar. 4, 2025

(54) METHOD AND APPARATUS FOR SELECTIVE FILM FORMATION IN SEMICONDUCTOR SUBSTRATE PROCESSING

(71) Applicant: KOKUSAI ELECTRIC CORPORATION, Tokyo (JP)

(72) Inventors: Kimihiko Nakatani, Toyama (JP); Yoshitomo Hashimoto, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 576 days.

(21) Appl. No.: 17/474,705

(22) Filed: Sep. 14, 2021

(65) Prior Publication Data

US 2022/0093388 A1  Mar. 24, 2022

(30) Foreign Application Priority Data

Sep. 18, 2020  (JP) .................................. 2020-157656

(51) Int. Cl.
*H01L 21/32* (2006.01)
*C23C 16/04* (2006.01)
*C23C 16/34* (2006.01)
*H01L 21/02* (2006.01)

(52) U.S. Cl.
CPC ............ *H01L 21/32* (2013.01); *C23C 16/045* (2013.01); *C23C 16/345* (2013.01); *H01L 21/0228* (2013.01)

(58) Field of Classification Search
CPC ... C23C 16/045; C23C 16/345; C23C 16/401; H01L 21/0214; H01L 21/02164; H01L 21/0217; H01L 21/02107–0228; H01L 21/02123–02126
See application file for complete search history.

(56) References Cited

U.S. PATENT DOCUMENTS

2017/0175266 A1  6/2017  Kumagai
2017/0314123 A1  11/2017  Shimizu
(Continued)

FOREIGN PATENT DOCUMENTS

JP  2012-104695 A  5/2012
JP  2017-069407 A  4/2017
(Continued)

OTHER PUBLICATIONS

Singapore Search Report issued on Oct. 21, 2022 for Singapore Patent Application No. 10202109930S.
(Continued)

*Primary Examiner* — Laura M Menz
*Assistant Examiner* — Candice Chan
(74) *Attorney, Agent, or Firm* — Volpe Koenig

(57) ABSTRACT

There is provided a technique that includes: (a) forming a base film, which has a reactivity with a film-forming inhibitor higher than a reactivity between the film-forming inhibitor and an inner surface of a concave portion formed on a surface of a substrate, at least in an upper portion in the concave portion by supplying a pre-treatment gas to the substrate; (b) forming a film-forming inhibition layer on a portion of a surface of the base film, which is formed in the upper portion in the concave portion, by supplying the film-forming inhibitor to the substrate; and (c) growing a film starting from a portion in the concave portion where the film-forming inhibition layer is not formed, by supplying a film-forming gas to the substrate.

22 Claims, 11 Drawing Sheets

(56) References Cited

U.S. PATENT DOCUMENTS

| | | |
|---|---|---|
| 2018/0237912 A1 | 8/2018 | Takahashi |
| 2020/0032390 A1 | 1/2020 | Kato |
| 2020/0279733 A1 | 9/2020 | Kumakura et al. |
| 2020/0279757 A1 | 9/2020 | Kumakura et al. |
| 2022/0230870 A1* | 7/2022 | Hashimoto ....... C23C 16/45527 |

FOREIGN PATENT DOCUMENTS

| | | |
|---|---|---|
| JP | 2017-201653 A | 11/2017 |
| JP | 2018-137369 A | 8/2018 |
| JP | 2020-017708 A | 1/2020 |
| KR | 10-2017-0072805 A | 6/2017 |
| TW | I688669 B | 3/2020 |

OTHER PUBLICATIONS

Singapore Written Opinion issued on Oct. 21, 2022 for Singapore Patent Application No. 10202109930S.
Japanese Office Action issued on Apr. 4, 2023 for Japanese Patent Application No. 2022-093008.
Taiwan Office Action issued on Jun. 20, 2022 for Taiwan Patent Application No. 110125426.
Korean Office Action issued on Sep. 15, 2023 for Korean Patent Application No. 10-2021-0121557.
Korean Office Action issued on Apr. 26, 2024 for Korean Patent Application No. 10-2021-0121557.

\* cited by examiner

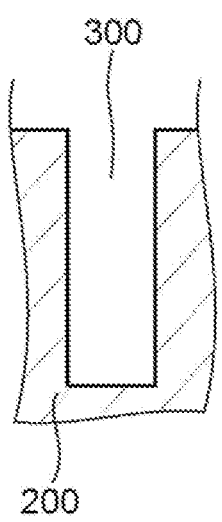 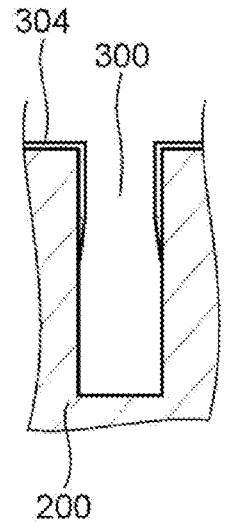 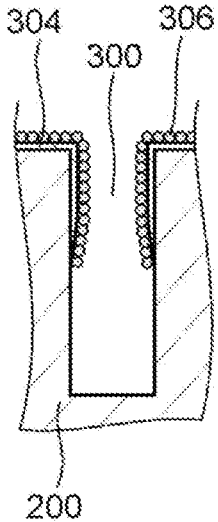 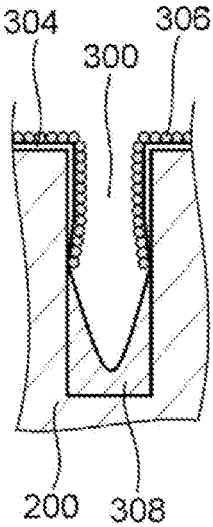
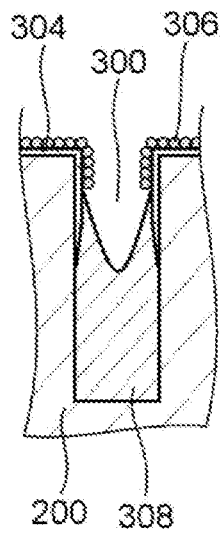 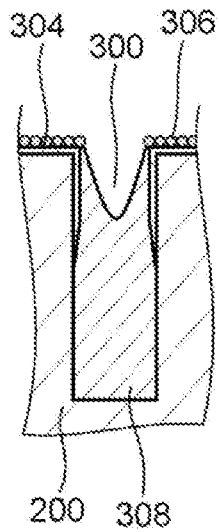 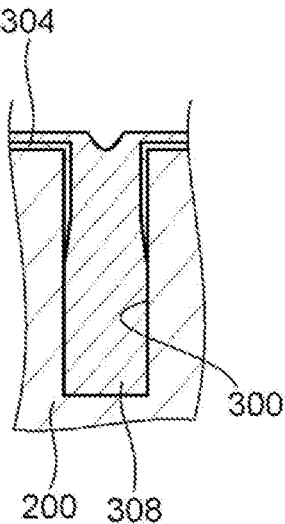

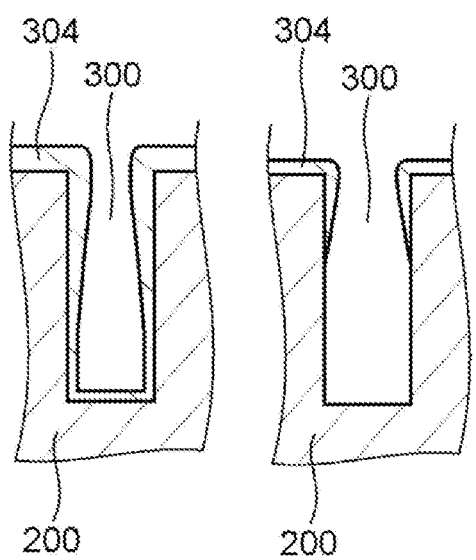

METHOD AND APPARATUS FOR SELECTIVE FILM FORMATION IN SEMICONDUCTOR SUBSTRATE PROCESSING

CROSS-REFERENCE TO RELATED APPLICATION

This application is based upon and claims the benefit of priority from Japanese Patent Application No. 2020-157656, filed on Sep. 18, 2020, the entire contents of which are incorporated herein by reference.

TECHNICAL FIELD

The present disclosure relates to a method of manufacturing a semiconductor device, a method of processing a substrate, a substrate processing apparatus, and a recording medium.

BACKGROUND

With the recent miniaturization and complexity of device shapes in the LSI manufacturing process, a technique of burying the interior of a concave portion such as a trench or a hole formed on the surface of a substrate with a film (gap fill technique) is used. In the related art, among the gap fill techniques, there is a method of supplying a film-forming inhibition gas to an upper portion in the concave portion formed on the surface of the substrate to form a film in the concave portion while lowering a deposition rate in the upper portion in the concave portion.

However, even when this method is used, the film-forming inhibition effect by the film-forming inhibition gas may not be sufficiently obtained, whereby sufficient burial characteristics cannot be obtained.

SUMMARY

Some embodiments of the present disclosure provide a technique that improves burial characteristics when burying an interior of a concave portion with a film.

According to embodiments of the present disclosure, there is provided a technique that includes: (a) forming a base film, which has a reactivity with a film-forming inhibitor higher than a reactivity between the film-forming inhibitor and an inner surface of a concave portion formed on a surface of a substrate, at least in an upper portion in the concave portion by supplying a pre-treatment gas to the substrate; (b) forming a film-forming inhibition layer on a portion of a surface of the base film, which is formed in the upper portion in the concave portion, by supplying the film-forming inhibitor to the substrate; and (c) growing a film starting from a portion in the concave portion where the film-forming inhibition layer is not formed, by supplying a film-forming gas to the substrate.

BRIEF DESCRIPTION OF DRAWINGS

FIG. 4A is a partially-enlarged cross-sectional view of a surface of a wafer 200 on which a concave portion 300 is formed. FIG. 4B is a partially-enlarged cross-sectional view of the surface of the wafer 200 after a base film 304 is formed in the entire concave portion 300. FIG. 4C is a partially-enlarged cross-sectional view of the surface of the wafer 200 after a film-forming inhibition layer 306 is formed in the upper portion in the concave portion 300 (the upper portion that is a portion of the base film 304). FIG. 4D is a partially-enlarged cross-sectional view of the surface of the wafer 200 after a film is grown starting from a non-formed portion of the film-forming inhibition layer 306 in the concave portion 300 to form a film 308 such that a lower portion in the concave portion 300 is buried. FIG. 4E is a partially-enlarged cross-sectional view of the surface of the wafer 200 after the film is further grown from the state of FIG. 4D starting from the non-formed portion of the film-forming inhibition layer 306 to form the film 308 such that a portion below a central portion in the concave portion 300 is buried. FIG. 4F is a partially-enlarged cross-sectional view of the surface of the wafer 200 after the film is further grown from the state of FIG. 4E starting from the non-formed portion of the film-forming inhibition layer 306 to form the film 308 such that a portion below the upper portion in the concave portion 300 is buried. FIG. 4G is a partially-enlarged cross-sectional view of the surface of the wafer 200 after the film is further grown from the state of FIG. 4F starting from the non-formed portion of the film-forming inhibition layer 306 to form the film 308 in the upper portion in the concave portion 300 and a portion other than the inside of the concave portion 300 and after the inside of the concave portion 300 is entirely buried with the film 308.

FIGS. 5A to 5C are partially-enlarged cross-sectional views similar to those of FIGS. 4A to 4C, respectively. FIG. 5D is a partially-enlarged cross-sectional view of the surface of the wafer 200 after a film is grown starting from a non-formed portion of the film-forming inhibition layer 306 in the concave portion 300 to form a film 308 such that the lower portion in the concave portion 300 is buried and after the film-forming inhibition layer 306 is removed. FIG. 5E is a partially-enlarged cross-sectional view of the surface of the wafer 200 after the film-forming inhibition layer 306 is formed again in the upper portion in the concave portion 300 in which the film 308 is formed to bury the lower portion of the concave portion 300. FIG. 5F is a partially-enlarged cross-sectional view of the surface of the wafer 200 after the film is further grown from the state of FIG. 5E starting from the non-formed portion of the film-forming inhibition layer 306 to form the film 308 such that a portion below the central portion in the concave portion 300 is buried and after the film-forming inhibition layer 306 is removed. FIG. 5G is a partially-enlarged cross-sectional view of the surface of the wafer 200 after the film-forming inhibition layer 306 is formed again in the upper portion in the concave portion 300 in which the film 308 is formed to bury a portion below the central portion of the concave portion 300. FIG. 5H is a partially-enlarged cross-sectional view of the surface of the wafer 200 after the film is further grown from the state of FIG. 5G starting from the non-formed portion of the film-forming inhibition layer 306 to form the film 308 such that a portion below the upper portion in the concave portion 300 is buried and after the film-forming inhibition layer 306 is removed. FIG. 5I is a partially-enlarged cross-sectional view of the surface of the wafer 200 after the film is further grown from the state of FIG. 5H to form the film 308 in the upper portion in the concave portion 300 and a portion other than the inside of the concave portion 300 and after the inside of the concave portion 300 is entirely buried with the film 308.

FIGS. 6A to 6G are partially-enlarged cross-sectional views showing an example of a processing sequence according to other embodiments of the present disclosure. FIG. 6A is a partially-enlarged cross-sectional view of a surface of a wafer 200 on which a concave portion 300 is formed. FIG. 6B is a partially-enlarged cross-sectional view of the surface of the wafer 200 after a base film 304 is formed in the upper portion in the concave portion 300. FIG. 6C is a partially-enlarged cross-sectional view of the surface of the wafer 200 after a film-forming inhibition layer 306 is formed in the upper portion in the concave portion 300 (the entire surface of the base film 304). FIG. 6D is a partially-enlarged cross-sectional view of the surface of the wafer 200 after a film is grown starting from a non-formed portion of the film-forming inhibition layer 306 in the concave portion 300 to form a film 308 such that the lower portion in the concave portion 300 is buried. FIG. 6E is a partially-enlarged cross-sectional view of the surface of the wafer 200 after the film is further grown from the state of FIG. 6D starting from the non-formed portion of the film-forming inhibition layer 306 to form the film 308 such that a portion below the central portion in the concave portion 300 is buried. FIG. 6F is a partially-enlarged cross-sectional view of the surface of the wafer 200 after the film is further grown from the state of FIG. 6E starting from the non-formed portion of the film-forming inhibition layer 306 to form the film 308 such that a portion below the upper portion in the concave portion 300 is buried. FIG. 6G is a partially-enlarged cross-sectional view of the surface of the wafer 200 after the film is further grown from the state of FIG. 6F starting from the non-formed portion of the film-forming inhibition layer 306 to form the film 308 in the upper portion in the concave portion 300 and a portion other than the inside of the concave portion 300 and after the inside of the concave portion 300 is entirely buried with the film 308.

FIGS. 7A to 7C are partially-enlarged cross-sectional views similar to those of FIGS. 6A to 6C, respectively. FIG. 7D is a partially-enlarged cross-sectional view of the surface of the wafer 200 after a film is grown starting from a non-formed portion of the film-forming inhibition layer 306 in the concave portion 300 to form a film 308 such that the lower portion in the concave portion 300 is buried and after the film-forming inhibition layer 306 is removed. FIG. 7E is a partially-enlarged cross-sectional view of the surface of the wafer 200 after the film-forming inhibition layer 306 is formed again in the upper portion in the concave portion 300 in which the film 308 is formed to bury the lower portion of the concave portion 300. FIG. 7F is a partially-enlarged cross-sectional view of the surface of the wafer 200 after the film is further grown from the state of FIG. 7E starting from the non-formed portion of the film-forming inhibition layer 306 to form the film 308 such that a portion below the central portion in the concave portion 300 is buried and after the film-forming inhibition layer 306 is removed. FIG. 7G is a partially-enlarged cross-sectional view of the surface of the wafer 200 after the film-forming inhibition layer 306 is formed again in the upper portion in the concave portion 300 in which the film 308 is formed to bury a portion below the central portion of the concave portion 300. FIG. 7H is a partially-enlarged cross-sectional view of the surface of the wafer 200 after the film is further grown from the state of FIG. 7G starting from the non-formed portion of the film-forming inhibition layer 306 to form the film 308 such that a portion below the upper portion in the concave portion 300 is buried and after the film-forming inhibition layer 306 is removed. FIG. 7I is a partially-enlarged cross-sectional view of the surface of the wafer 200 after the film is further grown from the state of FIG. 7H to form the film 308 in the upper portion in the concave portion 300 and a portion other than the inside of the concave portion 300 and after the inside of the concave portion 300 is entirely buried with the film 308.

FIG. 9A is a partially-enlarged cross-sectional view showing an example in which an base film 304 is formed in the entire concave portion 300 under a condition in which a step coverage is deteriorated. FIG. 9B is a partially-enlarged cross-sectional view showing an example in which the surface of the base film 304 in FIG. 9A is conformally etched, and a portion of the base film 304 is left in the upper portion in the concave portion 300.

DETAILED DESCRIPTION

Figure 1:
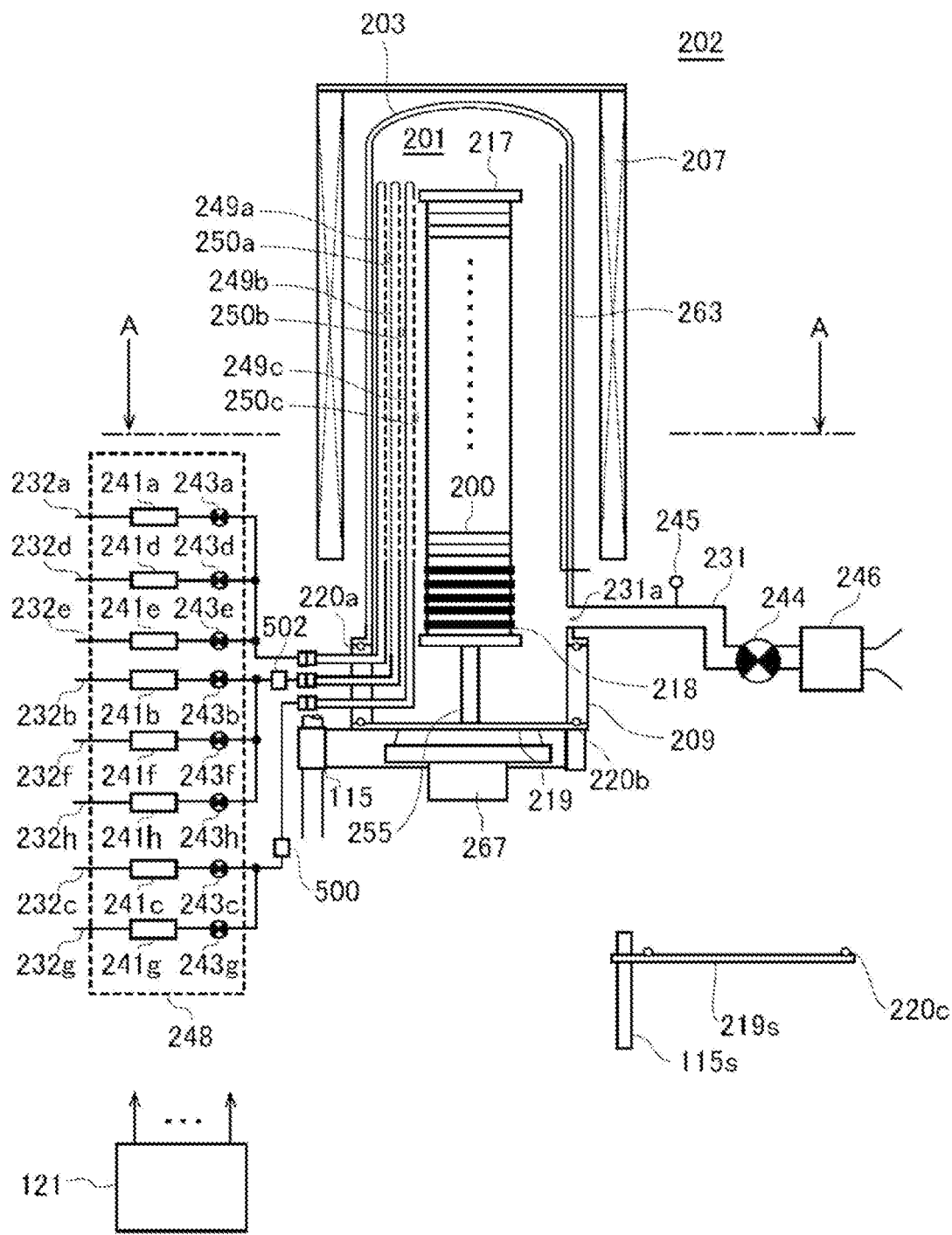
FIG. 1 is a schematic configuration view of a vertical process furnace of a substrate processing apparatus suitably used in embodiments of the present disclosure, in which a portion of a process furnace 202 is shown in a vertical cross section.

As a result of careful studies by the present disclosers, the present disclosers have found that when an inside of a concave portion formed on a surface of a substrate is buried with a film, by beforehand forming a base film having certain properties for a film-forming inhibitor in at least an upper portion in the concave portion, it is possible to appropriately and selectively form a film-forming inhibition layer on a portion of the base film formed in the upper portion in the concave portion. Further, the present disclosers have found that this allows a film to grow in the concave portion such that the film appropriately grows upward from a bottom of the inside of the concave portion, thereby improving burial characteristics. The present disclosure is based on the aforementioned findings found by the present disclosers. Hereinafter, two methods (the aforementioned embodiments) in the present disclosure will be described.

Some Embodiments of the Present Disclosure

Some embodiments of the present disclosure will be now described mainly with reference to FIGS. 1 to 5I. The drawings used in the following description are schematic, and dimensional relationships, ratios, and the like of various elements shown in the drawings may not match the actual ones. Further, the dimensional relationship, ratios, and the like of various elements among plural drawings may not match one another other.

(1) Configuration of Substrate Processing Apparatus

As shown in FIG. 1, a process furnace 202 includes a heater 207 as a temperature regulator (a heating part). The heater 207 has a cylindrical shape and is supported by a holding plate to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and has a cylindrical shape with both of its upper and lower ends opened. The upper end portion of the manifold 209 engages with the lower end portion of the reaction tube 203 to support the reaction tube 203. An O-ring 220a serving as a seal is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to accommodate a plurality of wafers 200 as substrates. The wafers 200 are processed in the process chamber 201.

Nozzles 249a to 249c as first to third supply parts are installed in the process chamber 201 such that the nozzles penetrate through a sidewall of the manifold 209. The nozzles 249a to 249c are also referred to as first to third nozzles, respectively. The nozzles 249a to 249c are made of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the corresponding upstream sides of gas flow. Gas supply pipes 232d and 232e are respectively connected to the gas supply pipe 232a at the downstream side of the valve 243a. Gas supply pipes 232f and 232h are respectively connected to the gas supply pipe 232b at the downstream side of the valve 243b. A gas supply pipe 232g is connected to the gas supply pipe 232c at the downstream side of the valve 243c. MFCs 241d to 241h and valves 243d to 243h are installed at the gas supply pipes 232d to 232h, respectively, sequentially from the corresponding upstream sides of gas flow. A remote plasma unit (hereinafter, RPU) 500 as a plasma excitation part (plasma generation part or plasma generator) configured to excite a gas into a plasma state is installed at the gas supply pipe 232c on the downstream side of the valve 243c. A RPU 502 is installed at the downstream side of a connection part of the gas supply pipes 232b and 232h. The gas supply pipes 232a to 232h are made of, for example, a metal material such as SUS.

Figure 2:
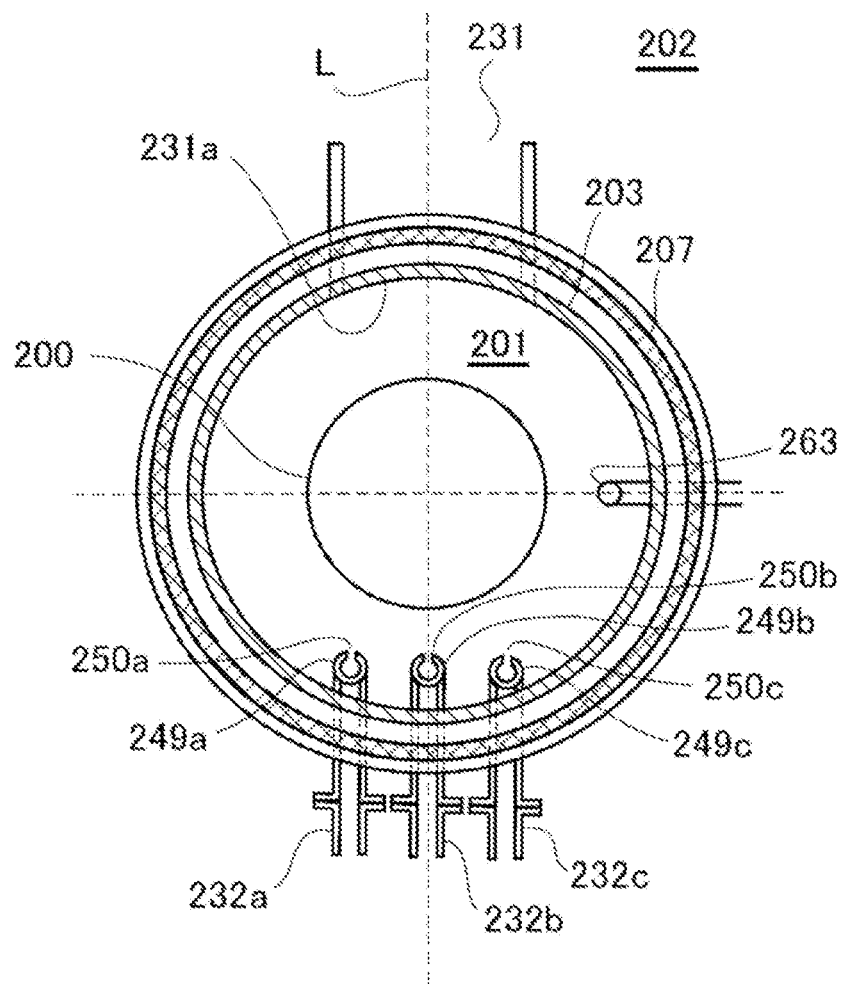
FIG. 2 is a schematic configuration view of a vertical process furnace of a substrate processing apparatus suitably used in embodiments of the present disclosure, in which a portion of the process furnace 202 is shown in a cross section taken along a line A-A in FIG. 1.

As shown in FIG. 2, the nozzles 249a to 249c are respectively disposed in a space with an annular plane-view shape between an inner wall of the reaction tube 203 and the wafers 200 such that the nozzles 249a to 249c extend upward along an arrangement direction of the wafers 200 from a lower portion to an upper portion of the inner wall of the reaction tube 203 thereof. That is, the nozzles 249a to 249c are respectively installed at a lateral side of a wafer arrangement region in which the wafers 200 are arranged, namely at a region which horizontally surrounds the wafer arrangement region, to extend along the wafer arrangement region. The nozzle 249b is disposed to face an exhaust port 231a to be described below on a straight line in a plane view, with centers of the wafers 200 loaded into the process chamber 201 interposed therebetween. The nozzles 249a and 249c are disposed to sandwich a straight line L passing through the nozzle 249b and a center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in a line symmetry with the straight line L as a symmetry axis. Gas supply holes 250a to 250c configured to supply a gas are formed on the side surfaces of the nozzles 249a to 249c, respectively. The gas supply holes 250a to 250c are respectively opened to oppose (face) the exhaust port 231a in the plane view, which allows a gas to be supplied toward the wafers 200. A plurality of gas supply holes 250a to 250c may be formed between the lower portion and the upper portion of the reaction tube 203.

A precursor gas is supplied from the gas supply pipe 232a into the process chamber 201 via the MFC 241a, the valve 243a, and the nozzle 249a.

A reaction gas is supplied from the gas supply pipe 232b into the process chamber 201 via the MFC 241b, the valve 243b, and the nozzle 249b.

A fluorine-containing gas or a catalyst gas is supplied from the gas supply pipe 232c into the process chamber 201 via the MFC 241c, the valve 243c, and the nozzle 249c.

An aminosilane-based gas is supplied from the gas supply pipe 232d into the process chamber 201 via the MFC 241d, the valve 243d, the gas supply pipe 232a, and the nozzle 249a. The aminosilane-based gas may contain a hydrocarbon group such as an alkyl group, in which case this gas may also be referred to as a hydrocarbon group-containing gas.

An inert gas is supplied from the gas supply pipes 232e to 232g into the process chamber 201 via the MFC 241e to 241g, the valve 243e to 243g, the gas supply pipes 232a to 232c, and the nozzles 249a to 249c, respectively.

An oxidizing gas is supplied from the gas supply pipe 232h into the process chamber 201 via the MFC 241h, the valve 243h, the gas supply pipe 232b, and the nozzle 249b.

A precursor gas supply system mainly includes the gas supply pipe 232a, the MFC 241a, and the valve 243a. A reaction gas supply system mainly includes the gas supply pipe 232b, the MFC 241b, and the valve 243b. A fluorine-containing gas supply system or a catalyst gas supply system mainly includes the gas supply pipe 232c, the MFC 241c, and the valve 243c. An aminosilane-based gas supply system (a hydrocarbon group-containing gas supply system) mainly includes the gas supply pipe 232d, the MFC 241d, and the valve 243d. The aminosilane-based gas supply system may be also referred to as a Si-containing gas supply system. An inert gas supply system mainly includes the gas supply pipes 232e to 232g, the MFCs 241e to 241g, and the valves 243e to 243g. An oxidizing gas supply system mainly includes the gas supply pipe 232h, the MFC 241h, and the valve 243h.

Here, since the precursor gas and the reaction gas act as a film-forming gas, one or both of the precursor gas supply system and the reaction gas supply system may also be referred to as a film-forming gas supply system. Further, since the precursor gas and the oxidizing gas act as a pre-treatment gas, the precursor gas supply system and the oxidation gas supply system may also be referred to as a pre-treatment gas supply system. Further, since the fluorine-containing gas and the aminosilane-based gas (the hydrocarbon group-containing gas) act as a film-forming inhibitor, the fluorine-containing gas supply system and the aminosilane-based gas supply system (the hydrocarbon group-containing gas supply system) are also referred to as a film-forming inhibitor supply system. Further, since the reaction gas or the oxidizing gas also includes a gas that acts as an additive gas to be described below, one or both of the reaction gas supply system and the oxidizing gas supply system may also be referred to as an additive gas supply system.

One or all of the above-described various supply systems may be configured as an integrated supply system 248 in which the valves 243a to 243h, the MFCs 241a to 241h, and the like are integrated. The integrated supply system 248 is connected to each of the gas supply pipes 232a to 232h. In addition, the integrated supply system 248 is configured such that operations of supplying various gases into the gas supply pipes 232a to 232h (that is, opening/closing operation of the valves 243a to 243h, flow rate regulation operation by the MFCs 241a to 241h, and the like) are controlled by a controller 121 to be described below. The integrated supply system 248 is configured as an integral type or division type integrated unit, and may be attached to and detached from the gas supply pipes 232a to 232h and the like on an integrated unit basis, so that maintenance, replacement, extension, and the like of the integrated supply system 248 may be performed on the integrated unit basis.

The exhaust port 231a configured to exhaust an internal atmosphere of the process chamber 201 is installed at a lower side of the sidewall of the reaction tube 203. As shown in FIG. 2, the exhaust port 231a is installed at a position opposing (facing) the nozzles 249a to 249c (the gas supply holes 250a to 250c) in the plane view, with the wafers 200 interposed therebetween. The exhaust port 231a may be installed between a lower portion and an upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245, which is a pressure detector (pressure detecting part) configured to detect an internal pressure of the process chamber 201, and an auto pressure controller (APC) valve 244, which is a pressure regulator (pressure regulation part). The APC valve 244 is configured such that a vacuum exhaust and a vacuum exhaust stop of the interior of the process chamber 201 may be performed by opening and closing the APC valve 244 while operating the vacuum pump 246 and such that the internal pressure of the process chamber 201 may be regulated by adjusting an opening degree of the APC valve 244 based on pressure information detected by the pressure sensor 245 while operating the vacuum pump 246. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is installed under the manifold 209. The seal cap 219 is made of, for example, a metal material such as stainless steel (SUS), and is formed in a disc shape. An O-ring 220b, which is a seal making contact with the lower end portion of the manifold 209, is installed on an upper surface of the seal cap 219. A rotation mechanism 267 configured to rotate a boat 217 to be described below is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transfer device (transfer mechanism) which loads or unloads (transfers) the wafers 200 into or from (out of) the process chamber 201 by moving the seal cap 219 up or down.

A shutter 219s, which serves as a furnace opening lid configured to be capable of hermetically sealing a lower end opening of the manifold 209, with the boat 217 unloaded from the interior of the process chamber 201 by moving the seal cap 219 down, is installed under the manifold 209. The shutter 219s is made of, for example, a metal material such as stainless steel (SUS), and is formed in a disc shape. An O-ring 220c, which is a seal making contact with the lower end portion of the manifold 209, is installed on an upper surface of the shutter 219s. An opening/closing operation (such as an elevation operation, a rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of, for example, a heat resistant material such as quartz or SiC. Heat insulating plates 218 made of, for example, a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that the interior of the process chamber 201 has a desired temperature distribution. The temperature sensor 263 is installed along the inner wall of the reaction tube 203.

Figure 3:
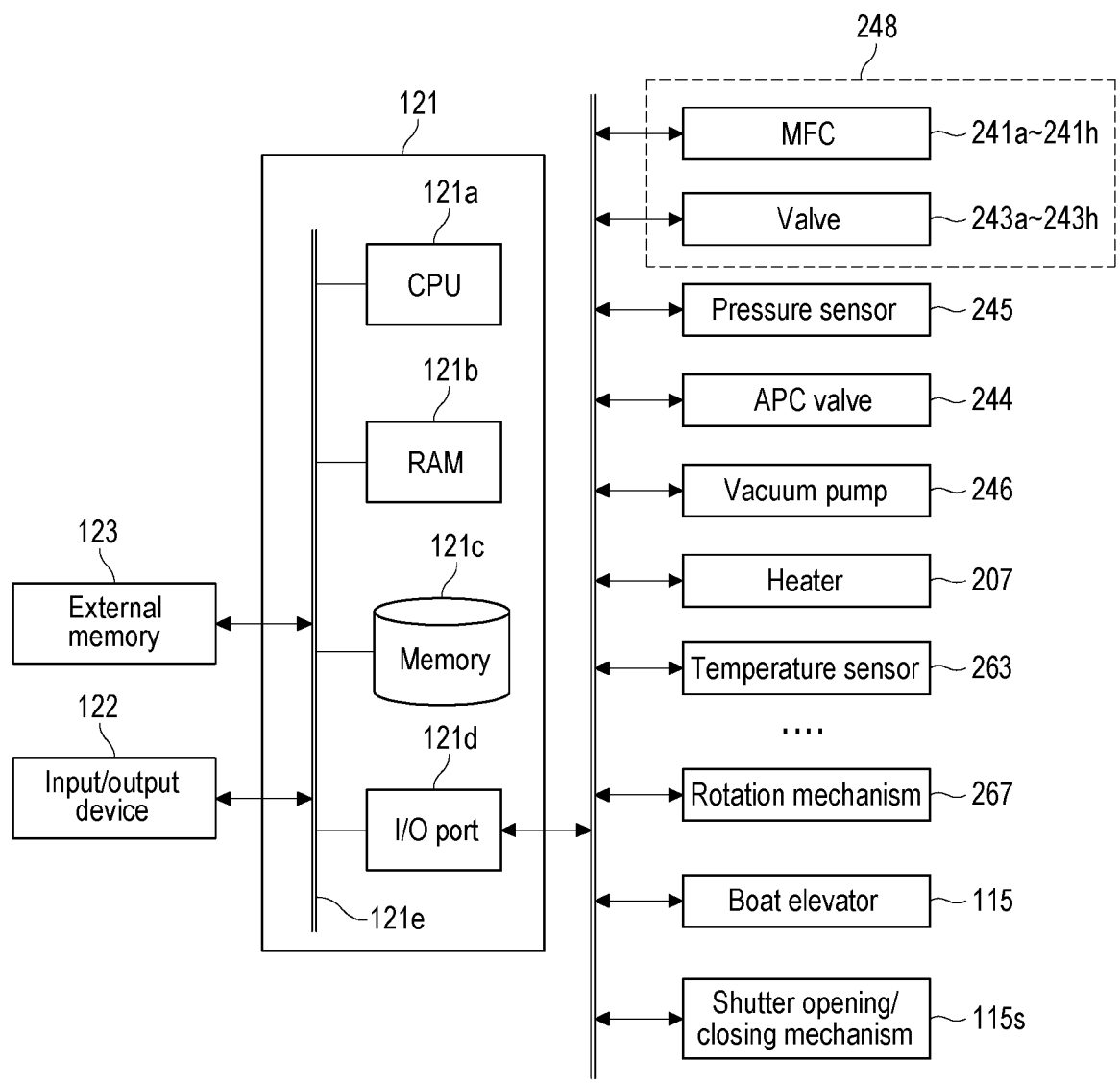
FIG. 3 is a schematic configuration diagram of a controller 121 of a substrate processing apparatus suitably used in embodiments of the present disclosure, in which a control system of the controller 121 is shown in a block diagram.

As shown in FIG. 3, a controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 configured as, for example, a touch panel or the like, is connected to the controller 121.

The memory 121c includes, for example, a flash memory, a hard disk drive (HDD), a solid state drive (SSD), or the like. A control program that controls operations of a substrate processing apparatus, a process recipe in which sequences, conditions, and the like of substrate processing to be described below are written, and the like are readably stored in the memory 121c. The process recipe functions as a program configured to be capable of causing the controller 121 to execute each sequence in the substrate processing to be described below, to obtain an expected result. Hereinafter, the process recipe, the control program, and the like may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121*b* is configured as a memory area (work area) in which a program, data, and the like read by the CPU 121*a* are temporarily stored.

The I/O port 121*d* is connected to the MFCs 241*a* to 241*h*, the valves 243*a* to 243*h*, the pressure sensor 245, the APC valve 244, the vacuum pump 246, the temperature sensor 263, the heater 207, the rotation mechanism 267, the boat elevator 115, the shutter opening/closing mechanism 115*s*, and the like.

The CPU 121*a* is configured to read the control program from the memory 121*c* and execute the same. The CPU 121*a* also reads the recipe from the memory 121*c* according to an input of an operation command from the input/output device 122. In addition, the CPU 121*a* is configured to control, according to the contents of the recipe thus read, the flow rate regulating operation of various kinds of gases by the MFCs 241*a* to 241*h*, the opening/closing operation of the valves 243*a* to 243*h*, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 and adjusting the rotation speed of the boat 217 with the rotation mechanism 267, the operation of moving the boat 217 up or down by the boat elevator 115, the opening/closing operation of the shutter 219*s* by the shutter opening/closing mechanism 115*s*, and on the like.

The controller 121 may be configured by installing, on the computer, the aforementioned program stored in an external memory 123. Examples of the external memory 123 may include a magnetic disc such as a HDD, an optical disc such as a CD, a magneto-optical disc such as a MO, a semiconductor memory such as a USB memory or a SSD, and the like. The memory 121*c* or the external memory 123 is configured as a computer-readable recording medium. Hereinafter, the memory 121*c* and the external memory 123 may be generally and simply referred to as a "recording medium." When the term "recording medium" is used herein, it may indicate a case of including the memory 121*c* only, a case of including the external memory 123 only, or a case of including both the memory 121*c* and the external memory 123. Furthermore, the program may be supplied to the computer by using communication means such as the Internet or a dedicated line, instead of using the external memory 123.

(2) Substrate Processing Process

As a process of manufacturing a semiconductor device by using the above-described substrate processing apparatus, an example of a process of bottom-up growing a film in a concave portion such as a trench or a hole formed on a surface of a wafer 200 as a substrate will be described mainly with reference to FIGS. 4A to 4G and 5A to 5I In the following description, operations of the respective parts constituting the substrate processing apparatus are controlled by the controller 121.

A processing sequence shown in FIGS. 4A to 4G and 5A to 5I includes:

Step A of forming a base film 304, which has a reactivity with a film-forming inhibitor higher than a reactivity between the film-forming inhibitor and an inner surface of a concave portion 300 formed on a surface of a wafer 200, at least in an upper portion in the concave portion 300 by supplying a pre-treatment gas to the wafer 200;

Step B of forming a film-forming inhibition layer 306 on a portion of a surface of the base film 304, which is formed in the upper portion in the concave portion 300 by supplying the film-forming inhibitor to the wafer 200; and Step C of growing a film 308 starting from a portion in the concave portion 300 where the film-forming inhibition layer 306 is not formed, by supplying a film-forming gas to the wafer 200, wherein after Step A is performed, Step B and Step C are performed a predetermined number of times (m times, where m is an integer of 1 or more).

Step A is also referred to as base film formation. Step B is also referred to as film-forming inhibition layer formation. Step C is also referred to as selective growth (selective film formation) or bottom-up growth (bottom-up film formation).

In the present disclosure, for the sake of convenience, the above-described processing sequence may be denoted as follows. The same denotation may be used in other embodiments and modifications to be described below.

Step $A \to$ (Step $B \to$ Step $C$)$\times m$

Here, a case where m=1 corresponds to a processing sequence shown in FIGS. 4A to 4G, and a case where m>1, that is, a case where m≥2, corresponds to a processing sequence shown in FIGS. 5A to 5I A case where m=3 is illustrated in the processing sequence shown in FIGS. 5A to 5I. The case where m=1, that is, the processing sequence shown in FIGS. 4A to 4G, can also be denoted as follows.

Step $A \to$ Step $B \to$ Step $C$

The processing sequence shown in FIGS. 4A to 4G and 5A to 5I shows an example in which the base film 304 is formed in the entire concave portion 300 in Step A, and in Step B, the film-forming inhibition layer 306 is selectively formed in an upper portion as a portion of the base film 304.

When the term "wafer" is used in the present disclosure, it may refer to "a wafer itself" or "a stacked body of a wafer and certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" or "concave portion," which is a portion of the substrate, is used in the present disclosure, it may be synonymous with the term "wafer."

(Wafer Charging and Boat Loading)

After the boat 217 is charged with a plurality of wafers 200 (wafer charging), the shutter 219*s* is moved by the shutter opening/closing mechanism 115*s* and the lower end opening of the manifold 209 is opened (shutter opening). Thereafter, as shown in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220*b*.

Here, single crystal silicon (Si) wafers may be used as the wafers 200 with which the boat 217 are charged. Further, as described above, as shown in FIGS. 4A and 5A, a concave portion 300 is formed on the surface of each of the wafers 200 with which the boat 217 are charged. The material of the inner surface (the outermost surface) of the concave portion 300, that is, the surface of the inner wall of the concave portion 300, is not particularly limited and may be, for example, single crystal Si (single crystal Si wafer itself), a silicon film (Si film), a germanium film (Ge film), a silicon germanium film (SiGe film), a silicon carbide film (SiC film), a silicon nitride film (SiN film), a silicon carbonitride film (SiCN film), a silicon oxide film (SiO film), a silicon oxynitride film (SiON film), a silicon oxycarbide film (SiOC film), a silicon oxycarbonitride film (SiOCN film), a silicon boronitride film (SiBN film), a silicon borocarbonitride film (SiBCN film), a boron nitride film (BN film), and the like. For example, it may be at least one selected from the group of the aforementioned materials.

(Pressure Regulation and Temperature Regulation)

The interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired processing temperature. At this time, a state of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the processing on the wafers 200 is completed.

Thereafter, Step A, Step B, and Step C are executed sequentially. Each of these steps will be described below.

[Step A (Base Film Formation)]

Figure 4A:
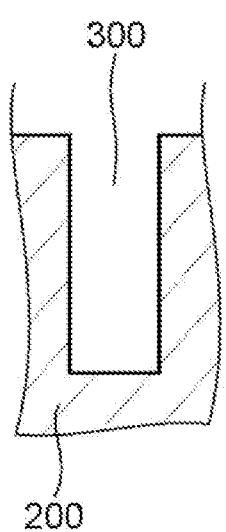
FIGS. 4A to 4G are partially-enlarged cross-sectional views showing an example of a processing sequence according to some embodiments of the present disclosure.
Figure 4B:
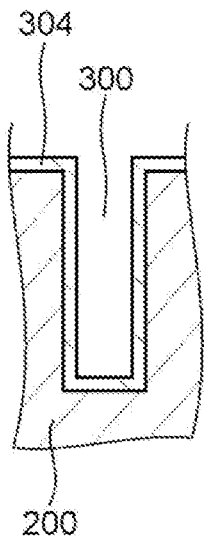
Figure 5A:
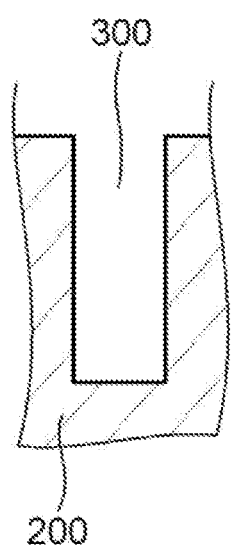
FIGS. 5A to 5I are partially-enlarged cross-sectional views showing another example of the processing sequence according to the some embodiments of the present disclosure.
Figure 5B:
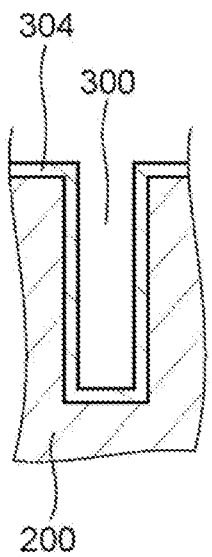

In this step, by supplying a pre-treatment gas to a wafer 200, a base film 304 having a reactivity with a film-forming inhibitor higher than a reactivity between the film-forming inhibitor and the inner surface of a concave portion 300 is formed at least in the upper portion in the concave portion 300, specifically, in the entire concave portion 300, as shown in FIGS. 4B and 5B.

For example, in this step, by alternately supplying a precursor gas and a modifying gas, as the pre-treatment gas, to the wafer 200, the base film 304 may be deposited on the entire concave portion 300 (Method 1-A1). Alternatively, by supplying the modifying gas as the pre-treatment gas to the wafer 200, the inner surface of the concave portion 300 may be modified to form the base film 304 in the entire concave portion 300 (Method 1-A2). By either method, a conformal base film 304 can be formed in the entire concave portion 300.

As the base film 304, for example, oxygen (O)-containing films such as a SiO film, a SiON film, a SiOC film, and a SiOCN film, that is, oxide film-based films, may be formed. As the base film 304, among the O-containing films, a Si- and O-containing film may be used in some embodiments, or a SiO film may be used in some embodiments. Hereinafter, an example of forming the base film 304, for example, a SiO film, will be described. As the base film 304, a film of a material which is the same as a material of the inner surface of the concave portion 300 may be used, but a film of a material different from that of the inner surface of the concave portion 300 may be used in some embodiments.

For example, when the SiO film is formed as the base film 304, an oxidizing gas may be used as the modifying gas. That is, in this case, as the pre-treatment gas, the precursor gas and the oxidizing gas (the modifying gas) may be alternately supplied to the wafer 200 to deposit the SiO film as the base film 304 in the concave portion 300 (Method 1-A1).

Further, for example, by supplying an oxidizing gas (a modifying gas) as the pre-treatment gas to the wafer 200, the inner surface of the concave portion 300 may be oxidized (modified) to form the SiO film as the base film 304 in the concave portion 300 (Method 1-A2).

As in Method 1-A1, when the precursor gas and the oxidizing gas, as the pre-treatment gas, are alternately supplied to the wafer 200, purging of the interior of the process chamber 201 with an inert gas may be performed between them. That is, in this step, a cycle may be performed a predetermined number of times (d times, where d is an integer of 1 or more), the cycle including non-simultaneously performing a step of supplying the precursor gas to the wafer 200, a step of purging the interior of the process chamber 201, a step of supplying the oxidizing gas, and a step of purging the interior of the process chamber 201. Further, a catalyst gas may also be supplied together with at least one selected from the group of the precursor gas and the oxidizing gas. In this case, a processing temperature may be lowered, such that a film can be formed at the room temperature. A processing sequence of Method 1-A1 may be expressed as follows, and any of the following four processing sequences may be performed.

(Precursor gas→Purge Oxidizing gas→Purge)×d (Precursor gas+Catalyst gas→Purge Oxidizing gas→Purge)×d (Precursor gas→Purge→Oxidizing gas+Catalyst gas→Purge)×d (Precursor gas+Catalyst gas→Purge→Oxidizing gas+ Catalyst gas→Purge)×d When the oxidizing gas is used as the pre-treatment gas, the valve 243h is opened to allow the oxidizing gas to be supplied into the gas supply pipe 232h. A flow rate of the oxidizing gas is regulated by the MFC 241h, and the oxidizing gas is supplied into the process chamber 201 via the nozzle 249b and is exhausted via the exhaust port 231a. In this operation, the oxidizing gas is supplied to the wafer 200. At this time, the valves 243e to 243g may be opened to allow an inert gas to be supplied into the process chamber 201 via the nozzles 249a to 249c, respectively.

When the precursor gas is further used as the pre-treatment gas, the valve 243a is opened to allow the precursor gas to be supplied into the gas supply pipe 232a. A flow rate of the precursor gas is regulated by the MFC 241a, and the precursor gas is supplied into the process chamber 201 via the nozzle 249a and is exhausted via the exhaust port 231a. In this operation, the precursor gas is supplied to the wafer 200. At this time, the valves 243e to 243g may be opened to allow an inert gas to be supplied into the process chamber 201 via the nozzles 249a to 249c, respectively.

When the catalyst gas is further used as the pre-treatment gas, the valve 243c is opened to allow the catalyst gas to be supplied into the gas supply pipe 232c. A flow rate of the catalyst gas is regulated by the MFC 241c, and the catalyst gas is supplied into the process chamber 201 via the nozzle 249c and is exhausted via the exhaust port 231a. In this operation, the catalyst gas is supplied to the wafer 200. At this time, the valves 243e to 243g may be opened to allow an inert gas to be supplied into the process chamber 201 via the nozzles 249a to 249c, respectively.

When the precursor gas and the oxidizing gas are alternately supplied, and when the purging of the interior of the process chamber 201 with the inert gas is performed between them, the valves 243e to 243g are opened to allow an inert gas to be supplied into the gas supply pipes 232e to 232g, respectively. A flow rate of the inert gas is regulated by the MFCs 241e to 241g, and the inert gas is supplied into the process chamber 201 via the nozzles 249a to 249c and is exhausted via the exhaust port 231a. In this operation, the interior of the process chamber 201 is purged with the inert gas.

In this step, a process condition under which the precursor gas is supplied when the SiO film is formed as the base film 304 according to Method 1-A1 is exemplified as follows.
  Processing temperature: room temperature (25 degrees C.) to 700 degrees C., specifically 200 to 650 degrees C.
  Processing pressure: 1 to 2,000 Pa, specifically 5 to 1,000 Pa
  Precursor gas supply flow rate: 1 to 3,000 sccm, specifically 1 to 500 sccm
  Precursor gas supply time: 1 to 120 seconds, specifically 1 to 60 seconds
  Catalyst gas supply flow rate: 0 to 2,000 sccm
  Inert gas supply flow rate (for each gas supply pipe): 0 to 20,000 sccm In this step, a process condition under which the oxidizing gas is supplied when the SiO film is formed as the base film 304 according to Method 1-A1 is exemplified as follows.
  Processing temperature: room temperature (25 degrees C.) to 700 degrees C., specifically 200 to 650 degrees C.
  Processing pressure: 1 to 4,000 Pa, specifically 1 to 3,000 Pa
  Oxidizing gas supply flow rate: 1 to 10,000 sccm, specifically 100 to 2,000 sccm
  Oxidizing gas supply time: 10 to 120 seconds, specifically 15 to 60 seconds
  Catalyst gas supply flow rate: 0 to 2,000 sccm
  Inert gas supply flow rate (for each gas supply pipe): 0 to 20,000 sccm In this step, a process condition under which the interior of the process chamber 201 is purged when the SiO film is formed as the base film 304 according to Method 1-A1 is exemplified as follows.
  Processing temperature: room temperature (25 degrees C.) to 700 degrees C., specifically 200 to 650 degrees C.
  Processing pressure: 1 to 100 Pa, specifically 1 to 20 Pa
  Inert gas supply flow rate (for each gas supply pipe): 500 to 20,000 sccm
  Inert gas supply time: 10 to 120 seconds, specifically 1 to 60 seconds In this step, a process condition under which the oxidizing gas is supplied when the SiO film is formed as the base film 304 according to Method 1-A2 is exemplified as follows.
  Processing temperature: 350 degrees C. to 1,200 degrees C., specifically 400 to 800 degrees C.
  Processing pressure: 1 to 4,000 Pa, specifically 1 to 3,000 Pa
  Oxidizing gas supply flow rate: 1 to 10,000 sccm, specifically 100 to 2,000 sccm
  Oxidizing gas supply time: 1 to 120 minutes, specifically 3 to 60 minutes
  Inert gas supply flow rate (for each gas supply pipe): 0 to 20,000 sccm In the present disclosure, a notation of a numerical range such as "350 to 1,200 degrees C." means that a lower limit value and an upper limit value are included in the range. Therefore, for example, "350 to 1,200 degrees C." means "350 degrees C. or higher and 1,200 degrees C. or lower." The same applies to other numerical ranges. The processing temperature means a temperature of the wafer 200, and the processing pressure means an internal pressure of the process chamber 201. Further, the gas supply flow rate: 0 sccm means a case where the gas is not supplied. These apply equally to the following description.

As the precursor gas, it may be possible to use, for example, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane gas ($Si_2Cl_6$, abbreviation: HCDS) gas, or an octachlorotrisilane ($Si_3Cl_8$, abbreviation: OCTS) gas. Further, as the precursor gas, it may be possible to use, for example, a fluorosilane-based gas such as a tetrafluorosilane ($SiF_4$) gas or a difluorosilane ($SiH_2F_2$) gas, a bromosilane-based gas such as a tetrabromosilane ($SiBr_4$) gas and a dibromosilane ($SiH_2Br_2$) gas, or an iodosilane-based gas such as a tetraiodosilane ($SiI_4$) gas or a diiodosilane ($SiH_2I_2$) gas. Further, as the precursor gas, it may be possible to use, for example, an aminosilane-based gas such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tert-butylamino)silane ($SiH_2[NH(C_4H_9)]_2$, abbreviation: BTBAS) gas, a (diisopropylamino)silane ($SiH_3[N(C_3H_7)_2]$, abbreviation: DIPAS) gas, an (ethylmethylamino)silane ($SiH_3[N(CH_3)(C_2H_5)]$) gas, a (dimethylamino)silane ($SiH_3[N(CH_3)_2]$) gas, a (di secondarybutylamino)silane ($SiH_3[H(C_4H_9)_2]$) gas, a (dimethylpiperidino)silane ($SiH_3[NC_5H_8(CH_3)_2]$) gas, or a (diethylpiperidino)silane ($SiH_3[NC_5H_8(C_2H_5)_2]$) gas. As the precursor gas, one or more selected from the group of these gases may be used.

As the oxidizing gas, it may be possible to use, for example, an oxygen ($O_2$) gas, a nitrous oxide ($N_2O$) gas, a nitric oxide (NO) gas, a nitrogen dioxide ($NO_2$) gas, an ozone ($O_3$) gas, water vapor ($H_2O$ gas), a carbon monoxide (CO) gas, a carbon dioxide ($CO_2$) gas, an $O_2$ gas+hydrogen ($H_2$) gas, an $O_3$ gas+$H_2$ gas, a $H_2O$ gas+$H_2$ gas, or the like. As the oxidizing gas, one or more selected from the group of these gases may be used.

In addition, in the present disclosure, side-by-side description of two gases such as "$O_3$ gas+$H_2$ gas" means a mixture of $O_3$ gas and $H_2$ gas. When the mixture is supplied, the two gases may be mixed (pre-mixed) in a supply pipe and then supplied into the process chamber 201, or the two gases may be supplied separately from different supply pipes into the process chamber 201 and then mixed (post-mixed) in the process chamber 201.

As the inert gas, it may be possible to use, for example, a nitrogen ($N_2$) gas or a rare gas such as an argon (Ar) gas, a helium (He) gas, a neon (Ne) gas, or a xenon (Xe) gas. As the inert gas, one or more selected from the group of these gases may be used. The same applies to each step to be described below.

By performing this step under each of the above-mentioned process conditions by using each of the above-mentioned gases according to each of the above-mentioned methods, a conformal SiO film may be formed as the base film 304 in the entire concave portion 300, as shown in FIGS. 4B and 5B.

In Step B to be described below, there may be a case in which when a fluorine (F)-terminated layer or a hydrocarbon group-terminated layer is formed as a film-forming inhibition layer 306 and a film of a material other than the SiO film is exposed on the inner surface of the concave portion 300, if an attempt is made to directly form the film-forming inhibition layer 306 on the inner surface of the concave portion 300 without forming the base film 304, the film-forming inhibition effect by the F-terminated layer or the hydrocarbon group-terminated layer as the film-forming inhibition layer 306 formed in the concave portion 300 may be reduced. That is, the film-forming inhibition effect by the F-terminated layer or the hydrocarbon group-terminated layer may be insufficient or limited.

As one factor for this, it is considered that a density of the F-terminated layer or the hydrocarbon group-terminated layer decreases due to, for example, elements, such as N and C, other than Si and O, contained in the inner surface of the concave portion 300. Further, as another factor, it is considered that for example, when the F-terminated layer or the hydrocarbon group-terminated layer is formed due to the elements other than Si and O in the inner surface of the concave portion 300, an energy by which the film-forming inhibitor is adsorbed on the base film 304 is weakened, such that the film-forming inhibitor adsorbed on the base film 304, that is, the F-termination or the hydrocarbon group termination is easily desorbed.

On the other hand, according to the embodiments, even when the elements other than Si and O, for example, the elements such as N and C, are contained in the inner surface of the concave portion 300, for example, a SiO film is formed as the base film 304 in the entire inner surface of the concave portion 300, and the F-terminated layer or the hydrocarbon group-terminated layer is formed as the film-forming inhibition layer 306 on the SiO film. As a result, it is possible to prevent an influence of the elements other than Si and O, contained in the inner surface of the concave portion 300 when forming the F-terminated layer or the hydrocarbon group-terminated layer, thereby enhancing the film-forming inhibition effect by the F-terminated layer or the hydrocarbon group-terminated layer.

From the foregoing, in Step B, when the F-terminated layer or the hydrocarbon group-terminated layer is formed as the film-forming inhibition layer 306, an O-containing film may be used as the base film 304 in some embodiments, a Si- and O-containing film among O-containing films may be used in some embodiments, and a SiO film among Si- and O-containing films may be used in some embodiments.

When the elements other than Si and O are not contained in the base film 304, it is possible to suppress the decrease in the density of the F-terminated layer or the hydrocarbon group-terminated layer as the film-forming inhibition layer 306 formed on the base film 304. Further, when the F-terminated layer or the hydrocarbon group-terminated layer is formed, the energy by which the film-forming inhibitor is adsorbed on the base film 304 becomes sufficiently high, thereby suppressing the desorption of the film-forming inhibitor adsorbed on the base film 304, that is, the desorption of the F termination and the hydrocarbon group termination.

Further, when the F-terminated layer is formed as the film-forming inhibition layer 306, F-containing radicals are generated. However, it is also possible to suppress etching damage to the base film 304 and the inner surface of the concave portion 300, which is caused by the F-containing radicals, by a strong Si—O bond contained in the base film 304. Such a suppression of etching damage may be obtained when the base film 304 contains the Si—O bond, and become greater when elements other than Si and O are not contained in the base film 304.

(Purging)

After the base film 304 is formed in the concave portion 300, an inert gas is supplied into the process chamber 201 from each of the nozzles 249a to 249c and is exhausted via the exhaust port 231a. The inert gas supplied from the nozzles 249a to 249c acts as a purge gas, whereby the interior of the process chamber 201 is purged to remove a gas, reaction by-products, and the like remaining in the process chamber 201 from the process chamber 201.

[Step B (Formation of Film-Forming Inhibition Layer)]

Figure 4C:
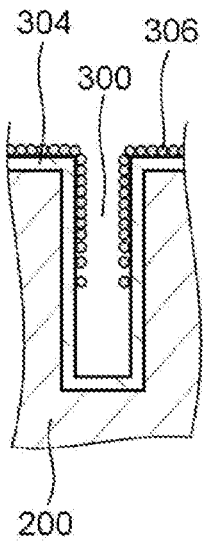
Figure 5C:
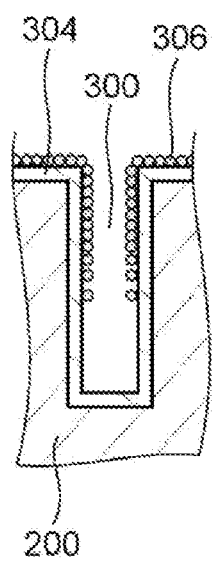

After Step A is completed and the purging of the interior of the process chamber 201 is performed, Step B is performed. The base film 304 is formed in the entire concave portion 300; and in Step B, a film-forming inhibitor is supplied to the wafer 200 to form the film-forming inhibition layer 306 on a portion of the surface of the base film 304, which is formed on an upper portion in the concave portion 300, as shown in FIGS. 4C and 5C. In this step, the film-forming inhibition layer 306 may be formed selectively (preferentially) on the portion of the surface of the base film 304, which is formed in the upper portion in the concave portion 300.

For example, in this step, the film-forming inhibitor may be supplied under a condition where the film formation inhibitor is consumed and/or deactivated in the upper portion in the concave portion 300. Here, the condition under which the film-forming inhibitor is consumed and/or deactivated in the upper portion in the concave portion 300 means a condition under which the film-forming inhibitor is consumed in the upper portion in the concave portion 300, a condition in which the film-forming inhibitor is deactivated in the upper portion in the concave portion 300, or a condition under which the film-forming inhibitor is consumed and deactivated in the upper portion in the concave portion 300. By supplying the film-forming inhibitor under such a condition, the film-forming inhibitor is consumed in the upper portion in the concave portion 300 such that it does not to reach the lower portion in the concave portion 300, or is deactivated in the upper portion in the concave portion 300 such that it does not reach the lower portion in the concave portion 300 in an active state, or both of these behaviors occur.

Under such a condition, by supplying a fluorine (F)-containing gas as the film-forming inhibitor, the F-terminated layer may be selectively formed as the film-forming inhibition layer 306 in a portion of the surface of the base film 304 formed in the concave portion 300, which corresponds to the upper portion in the concave portion 300.

For example, by supplying the F-containing gas as the film-forming inhibitor under a condition in which the F-containing gas is thermally decomposed, the film-forming inhibitor, that is, the F-containing gas or F-containing radicals generated by thermally decomposing the F-containing gas, may be consumed and/or deactivated in the upper portion in the concave portion 300. As a result, it is possible to selectively form the F-terminated layer as the film-forming inhibition layer 306 in the portion of the surface of the base film 304 formed in the concave portion 300, which corresponds to the upper portion in the concave portion 300, by the action of F-containing radicals (Method 1-B1).

Further, for example, by plasma-exciting and supplying the F-containing gas as the film-forming inhibitor, the film-forming inhibitor, that is, the F-containing gas or F-containing radicals generated by plasma-exciting the F-containing gas, may be consumed and/or deactivated in the upper portion in the concave portion 300. As a result, it is possible to selectively form the F-terminated layer as the film-forming inhibition layer 306 in the portion of the surface of the base film 304 formed in the concave portion 300, which corresponds to the upper portion in the concave portion 300, by the action of F-containing radicals (Method 1-B2).

Further, for example, by supplying the F-containing gas and an additive gas that reacts with the F-containing gas, as the film-forming inhibitor, the film-forming inhibitor, that is, the F-containing gas or F-containing radicals generated by the reaction between the F-containing gas and the additive gas, may be consumed and/or deactivated in the upper portion in the concave portion 300. As a result, it is possible to selectively form the F-terminated layer as the film-forming inhibition layer 306 in the portion of the surface of the base film 304 formed in the concave portion 300, which corresponds to the upper portion in the concave portion 300, by the action of F-containing radicals (Method 1-B3).

Further, under such a condition, by supplying a hydrocarbon group-containing gas as the film-forming inhibitor, a hydrocarbon group-terminated layer may be selectively formed as the film-forming inhibition layer 306 in the portion of the surface of the base film 304 formed in the concave portion 300, which corresponds to the upper portion in the concave portion 300.

For example, by supplying the hydrocarbon group-containing gas as the film-forming inhibitor under a condition that it is difficult for the gas to reach a bottom in the concave portion 300, that is, under a condition of gas shortage, the film-forming inhibitor may be consumed and/or deactivated in the upper portion in the concave portion 300. As a result, it is possible to form the hydrocarbon group-terminated layer as the film-forming inhibition layer 306 by selectively chemically adsorbing the hydrocarbon group-containing gas on the portion of the surface of the base film 304 formed in the concave portion 300, which corresponds to the upper portion in the concave portion 300 (Method 1-B4).

When the F-containing gas is used as the film-forming inhibitor, the valve 243c is opened to allow the F-containing gas to be supplied into the gas supply pipe 232c. The flow rate of the F-containing gas is regulated by the MFC 241c, and the F-containing gas is supplied into the process chamber 201 via the nozzle 249c and is exhausted via the exhaust port 231a. In this operation, the F-containing gas is supplied to the wafer 200. At this time, the valves 243e to 243g may be opened to allow an inert gas to be supplied into the process chamber 201 via the nozzles 249a to 249c, respectively. Further, when the F-containing gas is supplied into the process chamber 201 via the gas supply pipe 232c, the F-containing gas may be plasma-excited and supplied by applying a radio frequency power (RF power) to a RPU 500.

When the additive gas is used together with the F-containing gas, as the film-forming inhibitor, the valve 243b or the valve 243h is opened to allow the additive gas to be supplied into the gas supply pipe 232b or the gas supply pipe 232h. A flow rate of the additive gas is regulated by the MFC 241b or the MFC 241h, and the additive gas is supplied into the process chamber 201 via the nozzle 249b and is exhausted via the exhaust port 231a. In this operation, the additive gas is supplied to the wafer 200. At this time, the valves 243e to 243g may be opened to allow an inert gas to be supplied into the process chamber 201 via the nozzles 249a to 249c, respectively.

When the hydrocarbon group-containing gas is used as the film-forming inhibitor, the valve 243d is opened to allow the hydrocarbon group-containing gas to be supplied into the gas supply pipe 232d. A flow rate of the hydrocarbon group-containing gas is regulated by the MFC 241d, and the hydrocarbon group-containing gas is supplied into the process chamber 201 via the nozzle 249a and is exhausted via the exhaust port 231a. In this operation, the hydrocarbon group-containing gas is supplied to the wafer 200. At this time, the valves 243e to 243g may be opened to allow an inert gas to be supplied into the process chamber 201 via the nozzles 249a to 249c, respectively.

In this step, a process condition under which the F-containing gas is supplied according to Method 1-B1 is exemplified as follows.
  Processing temperature: 200 degrees C. to 600 degrees C., specifically 350 to 500 degrees C.
  Processing pressure: 1 to 2,000 Pa, specifically 1 to 1,000 Pa
  F-containing gas supply flow rate: 1 to 100 sccm, specifically 10 to 100 sccm
  F-containing gas supply time: 1 to 120 seconds, specifically 1 to 60 seconds
  Inert gas supply flow rate (for each gas supply pipe): 0 to 20,000 sccm In this step, a process condition under which the F-containing gas is supplied according to Method 1-B2 is exemplified as follows.
  Processing temperature: room temperature (25 degrees C.) to 600 degrees C., specifically 100 to 300 degrees C.
  Processing pressure: 1 to 2,000 Pa, specifically 1 to 1,000 Pa
  F-containing gas supply flow rate: 1 to 3,000 sccm, specifically 1 to 500 sccm
  F-containing gas supply time: 1 to 120 seconds, specifically 1 to 60 seconds
  Inert gas supply flow rate (for each gas supply pipe): 0 to 20,000 sccm
  Radio frequency power (RF power): 25 to 1,500 W In this step, a process condition under which the F-containing gas+the additive gas is supplied according to Method 1-B3 is exemplified as follows.
  Processing temperature: room temperature (25 degrees C.) to 600 degrees C., specifically room temperature to 300 degrees C.
  Processing pressure: 1 to 2,000 Pa, specifically 1 to 1,000 Pa
  F-containing gas supply flow rate: 1 to 3,000 sccm, specifically 1 to 500 sccm
  Additive gas supply flow rate: 1 to 3,000 sccm, specifically 1 to 500 sccm
  F-containing gas+additive gas supply time: 1 to 120 seconds, specifically 1 to 60 seconds
  Inert gas supply flow rate (for each gas supply pipe): 0 to 20,000 sccm In this step, a process condition under which the hydrocarbon group-containing gas is supplied according to Method 1-B4 is exemplified as follows.
  Processing temperature: room temperature (25 degrees C.) to 600 degrees C., specifically 100 to 500 degrees C.
  Processing pressure: 1 to 2,000 Pa, specifically 1 to 1,000 Pa
  Hydrocarbon group-containing gas supply flow rate: 1 to 100 sccm, specifically 10 to 100 sccm
  Hydrocarbon group-containing gas supply time: 1 to 120 seconds, specifically 1 to 60 seconds
  Inert gas supply flow rate (for each gas supply pipe): 0 to 20,000 sccm As the F-containing gas, it may be possible to use, for example, a nitrogen trifluoride ($NF_3$) gas, a chlorine fluoride (ClF) gas, a chlorine trifluoride ($ClF_3$) gas, a fluorine ($F_2$) gas, a nitrosyl fluoride (FNO) gas, a methane tetrafluoride ($CF_4$) gas, an ethane hexafluoride ($C_2F_6$) gas, a propane octafluoride ($C_3F_8$) gas, or the like. As the F-containing gas, one or more selected from the group of these gases may be used.

As the additive gas, it may be possible to use, for example, an ammonia ($NH_3$) gas, a hydrogen ($H_2$) gas, an oxygen ($O_2$) gas, a nitrous oxide ($N_2O$) gas, a nitric oxide (NO) gas, an isopropyl alcohol (($CH_3)_2CHOH$, abbreviation: IPA) gas, a methanol ($CH_3OH$) gas, water vapor ($H_2O$ gas), or the like. As the additive gas, one or more selected from the group of these gases may be used.

As the hydrocarbon group-containing gas, it may be possible to use, for example, a gas containing an alkyl group. As the gas containing an alkyl group, it may be possible to use, for example, a gas containing an alkylsilyl group in which an alkyl group is coordinated with Si, that is, an alkylsilane-based gas. The alkyl group is a general term for the remaining atomic groups obtained by removing one hydrogen (H) atom from alkane (chain saturated hydrocarbon represented by the chemical formula $C_nH_{2n+2}$), and is a functional group represented by the chemical formula $C_nH_{2n+1}$. As the alkyl group, an alkyl group having 1 to 5 carbon atoms may be used in some embodiments, and an alkyl group having 1 to 4 carbon atoms may be used in some embodiments. The alkyl group may be linear or branched. Examples of the alkyl group may include a methyl group, an ethyl group, an n-propyl group, an n-butyl group, an isopropyl group, an isobutyl group, a sec-butyl group, a tert-butyl group, and the like. Since the alkyl group is bonded to Si which is the central atom of the alkylsilane molecule, the alkyl group in alkylsilane can also be referred to as a ligand or an alkyl ligand.

The hydrocarbon group-containing gas may further contain an amino group. That is, the hydrocarbon group-containing gas may contain the hydrocarbon group and the amino group. As the hydrocarbon group- and amino group-containing gas, it may be possible to use, for example, an alkylaminosilane-based gas containing an alkyl group directly bonded to Si which is the central atom, and an amino group directly bonded to Si which is the central atom. The amino group refers to a functional group in which one or two hydrocarbon groups are coordinated with one nitrogen (N) atom (functional group in which one or both of hydrogen (H) atoms of the amino group represented by $-NH_2$ are substituted with a hydrocarbon group). When two hydrocarbon groups constituting a portion of the amino group are coordinated to one nitrogen (N) atom, the two hydrocarbon groups may be the same hydrocarbon group or different hydrocarbon groups. The hydrocarbon groups constituting the portion of the amino group are the same as the above-mentioned hydrocarbon group. Further, the amino group may have a cyclic structure. The amino group directly bonded to Si which is the central atom in alkylaminosilane may also be referred to as a ligand or an amino ligand. Further, the alkyl group directly bonded to Si which is the central atom in alkylaminosilane may also be referred to as a ligand or an alkyl ligand.

As the alkylaminosilane-based gas, it may be possible to use, for example, a gas of aminosilane compound represented by the following formula [1].

$$SiA_x[(NB_2)_{(4-x)}] \quad [1]$$

In the formula [1], A represents a hydrogen (H) atom, an alkyl group, or an alkoxy group, B represents a H atom or an alkyl group, and x represents an integer of 1 to 3. Specifically, when x is 1, A represents an alkyl group, and when x is 2 or 3, at least one selected from the group of A's represents an alkyl group.

In the formula [1], the alkyl group represented by A may be an alkyl group having 1 to 5 carbon atoms in some embodiments or an alkyl group having 1 to 4 carbon atoms in some embodiments. The alkyl group represented by A may be linear or branched. Examples of the alkyl group represented by A may include a methyl group, an ethyl group, an n-propyl group, an n-butyl group, an isopropyl group, an isobutyl group, a sec-butyl group, a tert-butyl group, and the like. The alkoxy group represented by A may be an alkoxy group having 1 to 5 carbon atoms in some embodiments or an alkoxy group having 1 to 4 carbon atoms in some embodiments. The alkyl group in the alkoxy group represented by A is the same as the alkyl group represented by A. When x is 2 or 3, two or three A's may be the same or different. The alkyl group represented by B is the same as the alkyl group represented by A. Further, two B's may be the same or different, and when x is 1 or 2, a plurality of ($NB_2$)s may be the same or different. Further, the two B's may be bonded to form a cyclic structure, and the formed cyclic structure may further have a substituent such as an alkyl group.

As the alkylaminosilane-based gas, it may be possible to use, for example, a gas of compound containing one amino group and three alkyl groups in one molecule. That is, a gas of compound in which A in the formula [1] is an alkyl group and x in the formula [1] is 3 may be used. As the alkylaminosilane-based gas, it may be possible to use an (alkylamino)alkylsilane-based gas, specifically, for example, a (dialkylamino)trialkylsilane-based gas such as a (dimethylamino)trimethylsilane (($CH_3)_2NSi(CH_3)_3$, abbreviation: DMATMS) gas, a (diethylamino)trimethylsilane (($C_2H_5)_2NSi(CH_3)_3$, abbreviation: DEATMS) gas, a (diethylamino)triethylsilane (($C_2H_5)_2NSi(C_2H_5)_3$, abbreviation: DEATES) gas, or a (dimethylamino)triethylsilane (($CH_3)_2NSi(C_2H_5)_3$, abbreviation: DMATES) gas. In addition to one amino group (dimethylamino group or diethylamino group), three alkyl groups (methyl groups or ethyl groups) are bonded to Si which is the central atom of DMATMS, DEATMS, DEATES, DMATES, and the like. That is, DMATMS, DEATMS, DEATES, DMATES, and the like contain one amino ligand and three alkyl ligands.

By performing this step under each of the above-mentioned process conditions using each of the above-mentioned gases by each of the above-mentioned methods, the F-terminated layer or the hydrocarbon group-terminated layer may be selectively (preferentially) formed as the film-forming inhibition layer 306 in the portion of the surface of the base film 304 formed in the entire concave portion 300, which corresponds to the upper portion in the concave portion 300, as shown in FIGS. 4C and 5C.

(Purging)

After the film-forming inhibition layer 306 is formed in the portion of the surface of the base film 304 formed in the concave portion 300, which corresponds to the upper portion in the concave portion 300, an inert gas is supplied into the process chamber 201 from each of the nozzles 249a to 249c and is exhausted through the exhaust port 231a. The inert gas supplied from the nozzles 249a to 249c acts as a purge gas, whereby the interior of the process chamber 201 is purged to remove a gas, reaction by-products, and the like remaining in the process chamber 201 from the process chamber 201.

[Step C (Selective Growth, Bottom-up Growth)]

Figure 4D:
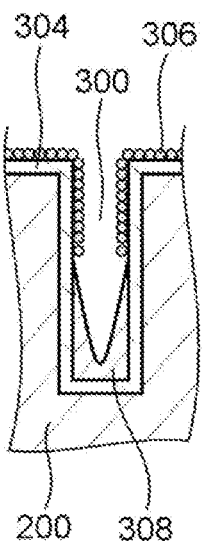
Figure 4E:
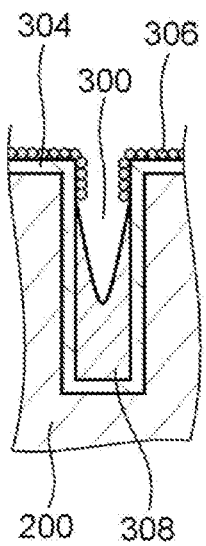
Figure 5D:
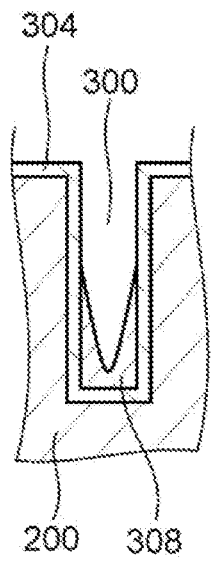

After Step B is completed and the purging of the interior of the process chamber 201 is performed, Step C is performed. In Step C, by supplying a film-forming gas to the wafer 200, a film 308 is grown starting from a portion in the concave portion 300 in which the film-forming inhibition layer 306 is not formed, that is, a portion of the base film 304 formed in the concave portion 300 in which the film-forming inhibition layer 306 is not formed, as shown in FIGS. 4D and 5D.

For example, in this step, by alternately supplying a precursor gas and a reaction gas, as a film-forming gas, to the wafer 200, the film 308 may be grown starting from the portion of the base film 304 formed in the concave portion 300 in which the film-forming inhibition layer 306 is not formed. That is, in this step, by performing a cycle a predetermined number of times (n times, where n is an integer of 1 or more), the cycle including non-simultaneously performing a step of supplying the precursor gas to the wafer 200 and a step of supplying the reaction gas to the wafer 200, the film 308 may be bottom-up grown upward from the bottom in the concave portion 300 starting from the portion of the base film 304 formed in the concave portion 300 in which the film-forming inhibition layer 306 is not formed, that is, the bottom of the base film 304 formed in the concave portion 300. In this case, purging of the interior of the process chamber 201 may be performed with an inert gas between those steps. That is, in this step, a cycle may be performed a predetermined number of times (n times, where n is an integer of 1 or more), the cycle including non-simultaneously performing a step of supplying the precursor gas to the wafer 200, a step of purging the interior of the process chamber 201, a step of supplying the reaction gas, and a step of purging the interior of the process chamber 201. Further, a catalyst gas may be supplied together with at least one selected from the group of the precursor gas and the reaction gas. In this case, the processing temperature may be lowered, so that a film may be formed at the room temperature. The processing sequence of this step may be expressed as follows, and any of the following four processing sequences may be performed.

(Precursor gas→Purge Reaction gas→Purge)×n (Precursor gas+Catalyst gas→Purge Reaction gas→Purge)×n (Precursor gas→Purge Reaction gas+Catalyst gas→Purge)×n (Precursor gas+Catalyst gas→Purge Reaction gas+Catalyst gas→Purge)×n When the precursor gas is used as the film-forming gas, the valve 243a is opened to allow the precursor gas to be supplied into the gas supply pipe 232a. The flow rate of the precursor gas is regulated by the MFC 241a, and the precursor gas is supplied into the process chamber 201 via the nozzle 249a and is exhausted via the exhaust port 231a. In this operation, the precursor gas is supplied to the wafer 200. At this time, the valves 243e to 243g may be opened to allow an inert gas to be supplied into the process chamber 201 via the nozzles 249a to 249c, respectively.

When the reaction gas is used as the film-forming gas, the valve 243b is opened to allow the reaction gas to be supplied into the gas supply pipe 232b. The flow rate of the reaction gas is regulated by the MFC 241b, and the reaction gas is supplied into the process chamber 201 via the nozzle 249b and is exhausted via the exhaust port 231a. In this operation, the reaction gas is supplied to the wafer 200. At this time, the valves 243e to 243g may be opened to allow an inert gas to be supplied into the process chamber 201 via the nozzles 249a to 249c, respectively.

When the catalyst gas is used as the film-forming gas, the valve 243c is opened to allow the catalyst gas to be supplied into the gas supply pipe 232c. The flow rate of the catalyst gas is regulated by the MFC 241c, and the catalyst gas is supplied into the process chamber 201 via the nozzle 249c and is exhausted via the exhaust port 231a. In this operation, the catalyst gas is supplied to the wafer 200. At this time, the valves 243e to 243g may be opened to allow an inert gas to be supplied into the process chamber 201 via the nozzles 249a to 249c, respectively.

When the precursor gas and the reaction gas are alternately supplied and the purging of the interior of the process chamber 201 is performed with the inert gas between them, the valves 243e to 243g are opened to allow an inert gas to be supplied into the gas supply pipes 232e to 232g, respectively. The flow rate of the inert gas is regulated by the MFCs 241e to 241g, and the inert gas is supplied into the process chamber 201 via the nozzles 249a to 249c and is exhausted via the exhaust port 231a. In this operation, the purging of the interior of the process chamber 201 is performed with the inert gas.

In this step, a process condition under which the precursor gas is supplied is exemplified as follows.

Processing temperature: room temperature (25 degrees C.) to 600 degrees C., specifically 50 to 550 degrees C.

Processing pressure: 1 to 2,000 Pa, specifically 10 to 1,333 Pa

Precursor gas supply flow rate: 1 to 2,000 sccm, specifically 10 to 1,000 sccm

Precursor gas supply time: 1 to 180 seconds, specifically 10 to 120 seconds

Catalyst gas supply flow rate: 0 to 2,000 sccm

Inert gas supply flow rate (for each gas supply pipe): 0 to 20,000 sccm

In this step, a process condition under which the reaction gas is supplied is exemplified as follows.

Processing temperature: room temperature (25 degrees C.) to 600 degrees C., specifically 50 to 550 degrees C.

Processing pressure: 1 to 5,000 Pa, specifically 10 to 3,000 Pa

Reaction gas supply flow rate: 1 to 20,000 sccm, specifically 10 to 2,000 sccm

Reaction gas supply time: 1 to 120 seconds, specifically 1 to 60 seconds

Catalyst gas supply flow rate: 0 to 2,000 sccm

Inert gas supply flow rate (for each gas supply pipe): 0 to 20,000 sccm

In this step, a process condition under which the interior of the process chamber 201 is purged is exemplified as follows.

Processing temperature: room temperature (25 degrees C.) to 600 degrees C., specifically 50 to 550 degrees C.

Processing pressure: 1 to 10 Pa, specifically 1 to 20 Pa

Inert gas supply flow rate (for each gas supply pipe): 500 to 20,000 sccm

Inert gas supply time: 10 to 120 seconds, specifically 1 to 60 seconds

As the precursor gas, it may be possible to use, for example, the halosilane-based gas such as the above-mentioned chlorosilane-based gas, fluorosilane-based gas, bromosilane-based gas, or iodosilane-based gas exemplified in the description of Step A, an aminosilane-based gas, or the like. Further, as the precursor gas, it may be possible to use, for example, an alkylhalosilane (alkylchlorosilane)-based gas such as a 1,1,2,2-tetrachloro-1,2-dimethyldisilane (($CH_3$)$_2$Si$_2$Cl$_4$, abbreviation: TCDMDS) gas or a 1,2-dichloro-1,1,2,2-tetramethyldisilane (($CH_3$)$_4$Si$_2$Cl$_2$, abbreviation: DCTMDS) gas, an alkylenechlorosilane-based gas such as a bis(trichlorosilyl)methane (($SiCl_3$)$_2$CH$_2$, abbreviation: BTCSM) gas, a 1,2-bis(trichlorosilyl)ethane (($SiCl_3$)$_2$C$_2$H$_4$, abbreviation: BTCSE) gas, or a 1,1,3,3-tetrachloro-1,3-disilacyclobutane ($C_2H_4Cl_4Si_2$, abbreviation: TCDSCB) gas, or the like. That is, as the halosilane (chlorosilane)-based gas, a halosilane (chlorosilane)-based gas containing a hydrocarbon group, that is, C, may also be used. As the precursor gas, one or more selected from the group of these gases may be used.

As the reaction gas, it may be possible to use, for example, the above-mentioned oxidizing gas (O-containing gas) exemplified in the description of Step A. Further, as the reaction gas, it may be possible to use, for example, a nitriding gas containing a N—H bond (N- and H-containing gas) such as an ammonia ($NH_3$) gas, a hydrazine ($N_2H_4$) gas, a diazene ($N_2H_2$) gas, or a $N_3H_8$ gas. As the reaction gas, one or more selected from the group of these gases may be used.

As the catalyst gas, it may be possible to use, for example, an amine-based gas containing C, N, and H. As the amine-based gas, it may be possible to use, for example, a cyclic amine-based gas such as a pyridine gas ($C_5H_5N$, abbreviation: py) gas, an aminopyridine ($C_5H_6N_2$) gas, a picoline ($C_6H_7N$) gas, a rutidine ($C_7H_9N$) gas, a piperazine ($C_4H_{10}N_2$) gas, or a piperidine ($C_5H_{11}N$) gas, a chain amine-based gas such as a triethylamine (($C_2H_5$)$_3$N, abbreviation: TEA) gas or a diethylamine (($C_2H_5$)$_2$NH, abbreviation: DEA) gas, or the like.

By supplying the precursor gas (+catalyst gas) to the wafer 200 under the above-mentioned processing conditions by using each of the above-mentioned gases, a Si-containing layer is formed on the surface of a region of the base film 304 formed in the concave portion 300 where the film-forming inhibition layer 306 is not formed. That is, the Si-containing layer is formed starting from the region of the base film 304 formed in the concave portion 300 where the film-forming inhibition layer 306 is not formed, that is, a region of the base film 304 corresponding to the bottom in the concave portion 300.

In this step, while suppressing formation of a Si-containing layer on the surface of a region of the base film 304 formed in the concave portion 300 where the film-forming inhibition layer 306 is formed, it is possible to selectively form a Si-containing layer on the surface of a region of the base film 304 where the film-forming inhibition layer 306 is not formed. When the film-forming inhibitory effect by the film-forming inhibition layer 306 is insufficient for some reason, a very small amount of Si-containing layer may be formed on the surface of the region of the base film 304 where the film-forming inhibition layer 306 is formed, but even in this case, a thickness of the Si-containing layer formed on the surface of the region of the base film 304 where the film-forming inhibition layer 306 is formed is much smaller than a thickness of the Si-containing layer formed on the surface of the region of the base film 304 where the film-forming inhibition layer 306 is not formed. Such selective formation of the Si-containing layer is possible because the F termination or the hydrocarbon group termination existing on the surface of the region of the base film 304 where the film-forming inhibition layer 306 is formed acts as a factor that inhibits the formation of the Si-containing layer (adsorption of Si) on the surface of the region of the base film 304 where the film-forming inhibition layer 306 is formed, that is, as a film-forming inhibitor. Further, the F termination or the hydrocarbon group termination existing on the surface of the region of the base film 304 where the film-forming inhibition layer 306 is formed is stably maintained without disappearing even when this step is performed. However, depending on the process conditions, the F termination or the hydrocarbon group termination existing on the surface of the region where the film-forming inhibition layer 306 is formed may gradually be desorbed as the aforementioned cycle is performed one or more times.

By supplying the reaction gas, for example, a nitriding gas (+catalyst gas), to the wafer 200 under the above-mentioned processing conditions by using each of the above-mentioned gases, at least a portion of the Si-containing layer formed on the surface of the region of the base film 304 formed in the concave portion 300 where the film-forming inhibition layer 306 is not formed is nitrided (modified). By nitriding the Si-containing layer, a layer containing Si and N, that is, a silicon nitride layer (SiN layer), is formed on the surface of the region of the base film 304 where the film-forming inhibition layer 306 is not formed. Further, the surface of the region of the base film 304 where the film-forming inhibition layer 306 is formed is maintained without being nitrided even when this step is performed. That is, the surface of the region of the base film 304 where the film-forming inhibition layer 306 is formed is stably maintained with F-terminated or hydrocarbon group-terminated without being nitrided. However, depending on the process conditions, the F termination or the hydrocarbon group termination existing on the surface of the region where the film-forming inhibition layer 306 is formed may gradually be desorbed as the aforementioned cycle is performed one or more times.

By supplying the reaction gas, for example, a nitriding gas+oxidizing gas (+catalyst gas), to the wafer 200 under the above-mentioned processing conditions, at least a portion of the Si-containing layer formed on the surface of the region of the base film 304 formed in the concave portion 300 where the film-forming inhibition layer 306 is not formed is oxynitrided (modified). By oxynitriding the Si-containing layer, a layer containing Si, O, and N, that is, a silicon oxynitride layer (SiON layer), is formed on the surface of the region of the base film 304 where the film-forming inhibition layer 306 is not formed. Further, the surface of the region of the base film 304 where the film-forming inhibition layer 306 is formed is maintained without being oxynitrided even when this step is performed. That is, the surface of the region of the base film 304 where the film-forming inhibition layer 306 is formed is stably maintained with F-terminated or hydrocarbon group-terminated without being oxynitrided. However, depending on the process conditions, the F termination or the hydrocarbon group termination existing on the surface of the region where the film-forming inhibition layer 306 is formed may gradually be desorbed as the aforementioned cycle is performed one or more times.

By performing a cycle a predetermined number of times (n times, where n is an integer of 1 or more), the cycle including non-simultaneously, that is, without synchronization, performing the above-described step of supplying the precursor gas to the wafer 200 and the above-described step of supplying the reaction gas to the wafer 200, for example, a silicon nitride film (SiN film) or silicon oxynitride film (SiON film) may be selectively grown as the film 308 on the surface of the region of the base film 304 formed in the concave portion 300 in the surface of the wafer 200 where the film-forming inhibition layer 306 is not formed, starting from the region. Then, by performing this cycle one or more times, it is possible to bottom-up grow, for example, the SiN film or SiON film as the film 308 upward from the bottom in the concave portion 300, as shown in FIGS. 4D to 4G and 5D to 5I. The aforementioned cycle may be performed multiple times in some embodiments. That is, the thickness of the SiN layer or SiON layer formed per cycle may be set to be smaller than a desired film thickness, and the aforementioned cycle may be performed multiple times until the film thickness of the film 308 formed by stacking SiN layers or SiON layers reaches the desired film thickness in some embodiments.

At a final stage of the film formation, as shown in FIGS. 4E to 4G and 5G to 5I, before the film 308 grows to the upper portion in the concave portion 300, the film-forming inhibition layer 306 (the F-terminated layer or the hydrocarbon group-terminated layer) may be removed and/or invalidated by the action of the film-forming gas (the precursor gas, the reaction gas, and the like) in some embodiments. As a result, it is possible to reset the surface state of the region of the base film 304 formed in the concave portion 300 where the film-forming inhibition layer 306 is formed. Here, the invalidation of the film-forming inhibition layer 306 means enabling adsorption of the film-forming gas (the precursor gas, the reaction gas, and the like) on the surface of the base film 304 or reaction of the surface of the base film 304 with the film-forming gas (the precursor gas, the reaction gas, and the like) by chemically changing a molecular structure of the film-forming inhibition layer 306 formed on the surface of the base film 304, an arrangement structure of atoms on the surface of the film-forming inhibition layer 306, and the like.

For example, the above-mentioned action may be realized by forming the film-forming inhibition layer 306 that causes selective rapture at the final stage of the film formation, in Step B. Specifically, for example, the above-mentioned action may be realized by forming the film-forming inhibition layer 306 that is desorbed and disappears at the final stage of the film formation, in Step B. Further, for example, the above-mentioned action may be realized by forming the film-forming inhibition layer 306 whose film-forming inhibition effect disappears at the final stage of the film formation, in Step B. Further, for example, the above-mentioned effect may be realized by forming the film-forming inhibition layer 306 whose film-forming inhibition effect is insufficient or limited at the final stage of the film formation, in Step B. Further, by obtaining, in advance, a relationship between each of the process conditions (processing temperature, processing pressure, film-forming inhibitor supply flow rate, and film-forming inhibitor supply time) in Step B and the number of cycles in Step C until selection rapture or the like occurs, the film-forming inhibition layer 306 may be appropriately formed based on the relationship. As a result, it is possible to prevent the film-forming inhibition layer 306 or components constituting the film-forming inhibition layer 306 from being introduced into an interface between the base film 304 and the film 308.

Further, for example, the above-mentioned action may be realized by performing Step C under the process condition in which at least one selected from the group of removal and invalidation of the film-forming inhibition layer 306 is performed, at the final stage of the film formation. Specifically, for example, the above-mentioned action may be realized by supplying the reaction gas to the wafer 200 under the process condition in which the film-forming inhibition layer 306 is desorbed and disappears, at the final stage of the film formation. Further, for example, the above-mentioned action may be realized by supplying the reaction gas to the wafer 200 under the process condition in which the film-forming inhibition effect by the film-forming inhibition layer 306 disappears, at the final stage of the film formation. Further, for example, the above-mentioned action may be realized by supplying the reaction gas to the wafer 200 under the process condition in which the film-forming inhibition effect by the film-forming inhibition layer 306 is reduced, at the final stage of the film formation. For example, by setting at least one selected from the group of the processing temperature, the processing pressure, and the reaction gas supply flow rate when supplying the reaction gas to the wafer 200 at the final stage of the film formation to be equal to or higher than those at an initial stage of the film formation and a middle stage of the film formation, the oxidizing power or nitriding power by the reaction gas can be increased, so that such processing conditions may be realized. Further, for example, by setting the reaction gas supply time when supplying the reaction gas to the wafer 200 at the final stage of the film formation to be longer than those at the initial stage of the film formation and the middle stage of the film formation, the oxidation time or nitriding time by the reaction gas may be lengthened, so that such processing conditions may be realized. As a result, it is possible to prevent the film-forming inhibition layer 306 or components constituting the film-forming inhibition layer 306 from being introduced into an interface between the base film 304 and the film 308.

In these cases, when the film 308 is the SiON film, an oxidizing gas such as an O-containing gas or an O-containing gas+H-containing gas may be use as the reaction gas supplied at the final stage of the film formation. In this case, the oxidizing gas may be plasma-excited and supplied. By applying RF power to the RPU 502 when supplying the oxidizing gas into the process chamber 201, the oxidizing gas may be plasma-excited and supplied. This makes it possible to efficiently and effectively perform at least one selected from the group of removal and invalidation of the film-forming inhibition layer 306. However, in the case of maintaining the composition of the film 308, the oxidizing gas may be plasma-excited and supplied under the condition that N is not desorbed from the film 308 in some embodiments.

When the film 308 is the SiN film, a nitriding gas such as a N- and H-containing gas may be used as the reaction gas supplied at the final stage of the film formation. In this case, the nitriding gas may be plasma-excited and supplied. By applying RF power to the RPU 502 when supplying the nitriding gas into the process chamber 201, the nitriding gas may be plasma-excited and supplied. This makes it possible to efficiently and effectively perform at least one selected from the group of removal and invalidation of the film-forming inhibition layer 306.

The formation of the film-forming inhibition layer 306 to be removed at the final stage of the film formation, the formation of the film-forming inhibition layer 306 to be invalidated at the final stage of the film formation, the removal of the film-forming inhibition layer 306 at the final stage of the film formation, the invalidation of the film-forming inhibition layer 306 at the final stage of the film formation, and the like, as described above, may be performed in the same manner in other embodiments to be described below.

Figure 5E:
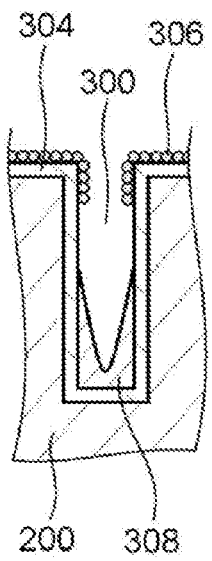
Figure 5F:
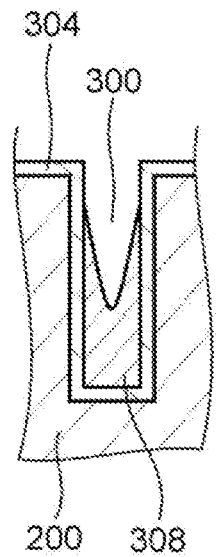
Figure 5G:
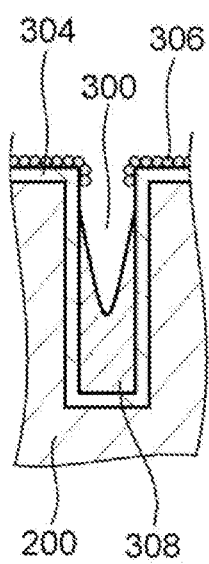
Figure 5H:
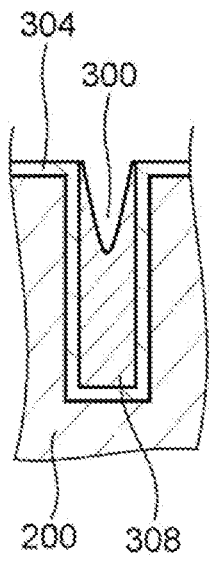

Further, as shown in FIGS. 5D and 5F, the film-forming inhibition layer 306 (the F-terminated layer or hydrocarbon group-terminated layer) may be removed and/or invalidated by the action of the film-forming gas (the precursor gas, the reaction gas, and the like) during the film formation. For example, when the oxidizing gas such as the O-containing gas+H-containing gas is used as the reaction gas, desorption of the film-forming inhibition layer 306 and disappearance, reduction, or the like of the film-forming inhibition effect in the film-forming inhibition layer 306 may occur due to a high oxidizing power of the oxidizing gas. In this case, as shown in FIGS. 5E and 5G, Step B may be performed again to repair the film-forming inhibition layer 306 or form the film-forming inhibition layer 306 again.

Further, as in the following processing sequences, the film-forming inhibitor may be supplied to form the film-forming inhibition layer 306 each time before the cycle in Step C is performed. In this case, any of the following four processing sequences may be performed. In the following processing sequences, only Step B and Step C are extracted and shown for the sake of convenience.

(Film-forming inhibitor→Purge Precursor
gas→Purge Reaction gas→Purge)×$n$ (Film-forming inhibitor→Purge Precursor gas+Catalyst gas→Purge→Reaction gas→Purge)×$n$ (Film-forming→inhibitor Purge→Precursor
gas→Purge Reaction→gas+Catalyst
gas→Purge)×$n$ (Film-forming inhibitor→Purge→Precursor gas+
Catalyst gas→Purge→Reaction gas+Catalyst
gas→Purge)×$n$ According to these processing sequences, since the film-forming inhibition layer 306 removed and/or invalidated in Step C may be repaired or formed every cycle, it is further effective, for example, as described above, when the oxidizing gas having a high oxidizing power is used. In this case, the base film 304 and the film 308 are made of different materials. This is because, in a case where the materials of the base film 304 and the film 308 are the same, the film-forming inhibition layer 306 may be also formed on the surface of the film 308 (or a layer constituting the film 308) formed in a first cycle, in at least one subsequent cycle, and thereafter, it may not be possible to form a film.

Further, in a case where selective rapture occurs during the film formation, the base film 304 may be etched. For example, in the case where the selective rapture occurs, the film 308 may be formed on the surface of the region of the base film 304 where the film-forming inhibition layer 306 has been formed. In this case, the film 308 formed on the surface of the region of the base film 304 where the film-forming inhibition layer 306 has been formed may be removed by an etching process with the use of a F-containing gas or the like. However, at this time, the base film 304 may be etched together. In such a case, as in the following processing sequence, the Step A may be performed again to repair the base film 304 or form the base film 304 again. In this case, performing the Step A and performing the Step B and the Step C a predetermined number of times ($m_1$ times, where $m_1$ is an integer of 1 or more) are performed a predetermined number of times ($m_2$ times, where $m_2$ is an integer of 1 or more).

[Step $A$→(Step $B$→Step $C$)×$m_1$]×$m_2$

The repair of the film-forming inhibition layer 306, the re-formation of the film-forming inhibition layer 306, the repair of the base film 304, the re-formation of the base film 304, and each processing sequence for performing them, as described above, may be performed in the same manner in the embodiments to be described below.

(After-Purge and Returning to Atmospheric Pressure)

Figures 4F, 4G:
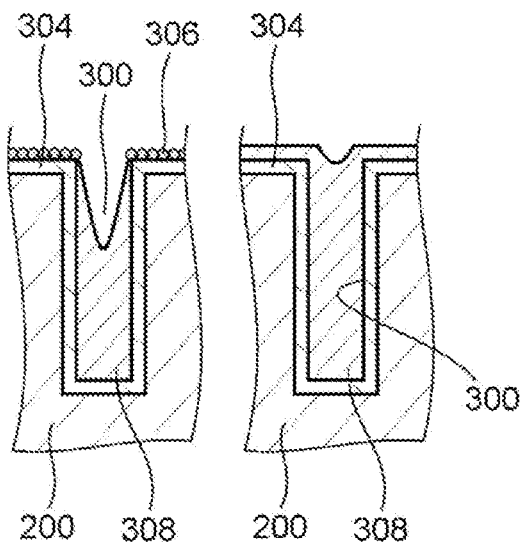
Figure 5I:
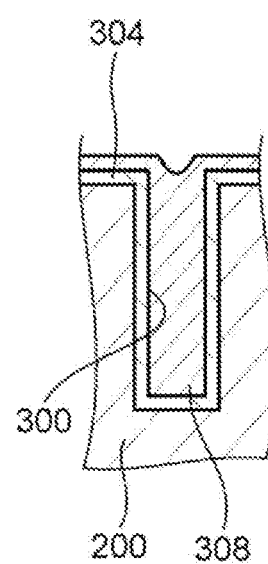

As shown in FIGS. 4G and 5I, after the burial of the concave portion 300 with the film 308 is completed, an inert gas as a purge gas is supplied into the process chamber 201 from each of the nozzles 249a to 249c and is exhausted via the exhaust port 231a. As a result, the interior of the process chamber 201 is purged to remove a gas, reaction by-products, and the like remaining in the process chamber 201 from the process chamber 201 (after-purge). Thereafter, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

Thereafter, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter closing). The processed wafers 200 are unloaded from the reaction tube 203, and then are discharged from the boat 217 (wafer discharging).

In a state where the interior of the concave portion 300 is buried with the film 308, the SiO film formed as the base film 304 remains at an interface between the surface in the concave portion 300 and the film 308. However, this is not problematic if the thickness of the SiO film formed as the base film 304 is set to a thickness of, for example, 10 to 20 Å (1 to 2 nm) or less which is a natural oxide film level or less. Further, the thickness of the SiO film formed as the base film 304 may be made greater than the thickness of the natural oxide film level, and if this is acceptable in a process or a device, such a technique may be used.

(3) Effects of the Embodiments

According to the embodiments, one or more effects set forth below may be achieved.

In Step A, by forming the base film 304 having the reactivity with the film-forming inhibitor higher than the reactivity between the film-forming inhibitor and the inner surface of the concave portion 300 formed on the surface of the wafer 200, in the concave portion 300, it is possible to selectively and efficiently form an appropriate film-forming inhibition layer 306 having a high density and a high film-forming inhibition effect on a portion of the base film 304, which is formed in the upper portion in the concave portion 300, thereby improving the burial characteristics. This enables seamless and void-free gap fill.

In Step A, by forming the O-containing film as the base film 304, it is possible to selectively and efficiently form an appropriate film-forming inhibition layer 306 having a high density and a high film-forming inhibition effect on a portion of the base film 304, which is formed in the upper portion in the concave portion 300 formed on the surface of the wafer 200, thereby further improving the burial characteristics.

In Step A, by forming the oxide film as the base film 304, it is possible to selectively and efficiently form an appropriate film-forming inhibition layer 306 having a high density and a high film-forming inhibition effect on a portion of the base film 304, which is formed in the upper portion in the concave portion 300 formed on the surface of the wafer 200, thereby further improving the burial characteristics.

In Step A, by forming the Si- and O-containing film as the base film 304, it is possible to selectively and efficiently form an appropriate film-forming inhibition layer 306 having a high density and a high film-forming inhibition effect on a portion of the base film 304, which is formed in the upper portion in the concave portion 300 formed on the surface of the wafer 200, thereby further improving the burial characteristics.

In Step A, by forming the SiO film as the base film 304, it is possible to selectively and efficiently form an appropriate film-forming inhibition layer 306 having a high density and a high film-forming inhibition effect on a portion of the base film 304, which is formed in the upper portion in the concave portion 300 formed on the surface of the wafer 200, thereby furthermore improving the burial characteristics.

In Step A, by forming the base film 304 in the entire concave portion 300, the base film 304 may not be formed selectively in a specific portion, whereby a control when forming the base film 304 may be simplified.

In Step A, by alternately supplying the precursor gas and the modifying gas as the pre-treatment gas to deposit the base film 304 in the concave portion 300 or by supplying the modifying gas as the pre-treatment gas to modify the inner surface of the concave portion 300 to form the base film 304 in the concave portion 300, it is possible to form a uniform base film 304 in the entire concave portion.

In Step A, by forming the base film 304 in the entire concave portion 300, it is possible to prevent the inner surface of the concave portion 300 from being exposed to a reactive substance in the subsequent steps, whereby the inner surface of the concave portion 300 may be protected from chemical and physical actions.

In Step B, by using the F-containing gas as the film-forming inhibitor, it is possible to form the F-terminated layer as the film-forming inhibition layer 306 and to selectively and efficiently form an appropriate film-forming inhibition layer 306 having a high density and a high film-forming inhibition effect on a portion of the base film 304, which is formed in the upper portion in the concave portion 300 formed on the surface of the wafer 200, thereby further improving the burial characteristics. In this case, a gas other than the O- and H-containing gas may be used as the film-forming gas (the precursor gas, the reaction gas, and the like). This is because, for example, when the O- and H-containing gas is used as the reaction gas, the F-terminated layer formed as the film-forming inhibition layer 306 may be desorbed. In this case, a nitriding gas such as a N- and H-containing gas as the reaction gas may be used. However, as described above, when the film-forming inhibition layer 306 is desorbed and disappears at the final stage of the film formation, the O- and H-containing gases may be used as the reaction gas. Further, as described above, when the film-forming inhibition layer 306 is desorbed and disappears, and when the film-forming inhibition layer 306 is appropriately formed again, the O- and H-containing gas may be used as the reaction gas.

In Step B, by using the hydrocarbon group-containing gas as the film-forming inhibitor, it is possible to form the hydrocarbon group-terminated layer as the film-forming inhibition layer 306 and to selectively and efficiently form an appropriate film-forming inhibition layer 306 having a high density and a high film-forming inhibition effect on a portion of the base film 304, which is formed in the upper portion in the concave portion 300 formed on the surface of the wafer 200, thereby further improving the burial characteristics. In this case, since the hydrocarbon group-terminated layer formed as the film-forming inhibition layer 306 may be desorbed, for example, under a temperature of 500 degrees C. or higher, the film may be formed under a temperature lower than the temperature of 500 degrees C. In this case, the catalyst gas may be supplied together with at least one selected from the group of the precursor gas and the reaction gas, for example, to lower the processing temperature in Step C. As a result, for example, it is possible to set the processing temperature to the room temperature to 200 degrees C., furthermore the room temperature to 120 degrees C.

Other Embodiments in the Present Disclosure

Other embodiments of the present disclosure will be now described mainly with reference to FIGS. 1 to 3 and 6A to 9B. A substrate processing apparatus in the embodiments has the same configuration as the substrate processing apparatus in the above-described embodiments, and embodiments other than those in the embodiments to be described below are the same as those described in the above-described embodiments. Hereinafter, a substrate processing process in these embodiments will be described.

Here, as a process of manufacturing a semiconductor device by using the above-described substrate processing apparatus, an example of a process of bottom-up growing a film in a concave portion such as a trench or a hole formed on a surface of a wafer 200 will be described mainly with reference to FIGS. 6A to 6G and 7A to 7I. In the following description, operations of the respective parts constituting the substrate processing apparatus are controlled by a controller 121.

A processing sequence shown in FIGS. 6A to 6G and 7A to 7I includes:
   Step A of forming a base film 304 having a reactivity with a film-forming inhibitor higher than a reactivity between the film-forming inhibitor and an inner surface of a concave portion 300 formed on a surface of a wafer 200 at least in an upper portion in the concave portion 300 by supplying a pre-treatment gas to the wafer 200;
   Step B of forming a film-forming inhibition layer 306 on a portion of a surface of the base film 304, which is formed in the upper portion in the concave portion 300 by supplying the film-forming inhibitor to the wafer 200; and
   Step C of growing a film 308 starting from a portion in the concave portion 300 where the film-forming inhibition layer 306 is not formed, by supplying a film-forming gas to the wafer 200, wherein after Step A is performed, Step B and Step C are performed a predetermined number of times (m times, where m is an integer of 1 or more).

In the these embodiments, as in the above-described embodiments, Step A is also referred to as a base film formation, Step B is also referred to as a film-forming inhibition layer formation, and Step C is also referred to as selective growth (selective film formation) or bottom-up growth (bottom-up film formation). The above-described processing sequence may be denoted as follows, as in the above-described embodiments.

Step $A \rightarrow$ (Step $B \rightarrow$ Step $C$)$\times m$

Here, a case where m=1 corresponds to a processing sequence shown in FIGS. 6A to 6G, and a case where m>1, that is, a case where m≥2, corresponds to a processing sequence shown in FIGS. 7A to 7I. A case where m=3 is illustrated in the processing sequence shown in FIGS. 7A to 7I. The case where m=1, that is, the processing sequence shown in FIGS. 6A to 6G, may also be denoted as follows.

Step A→Step B→Step C

The processing sequence shown in FIGS. 6A to 6G and 7A to 7I shows an example in which the base film 304 is selectively formed in the upper portion in the concave portion 300 in Step A, and the film-forming inhibition layer 306 is formed in the entire base film 304 in Step B. In this case, as a result, the film-forming inhibition layer 306 is formed on a portion of the base film 304, which is formed in the upper portion in the concave portion 300.

Wafer charging, boat loading, pressure regulation, temperature regulation, after-purge, and returning to atmospheric pressure in these embodiments may be performed in the same manner as those in the above-described embodiments. Hereinafter, Steps A, B, and C in these embodiments will be described.

[Step A (Base Film Formation)]

Figure 7A:
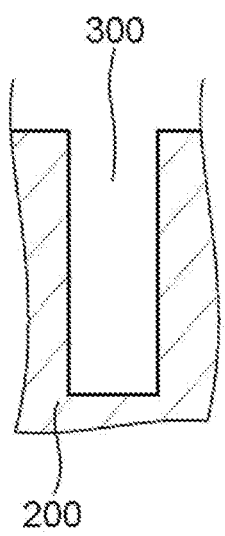
FIGS. 7A to 7I are partially-enlarged cross-sectional views showing another example of the processing sequence according to the other embodiments of the present disclosure.
Figure 7B:
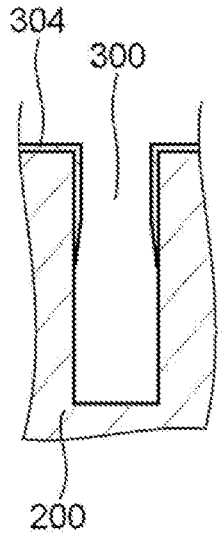
Figure 8:
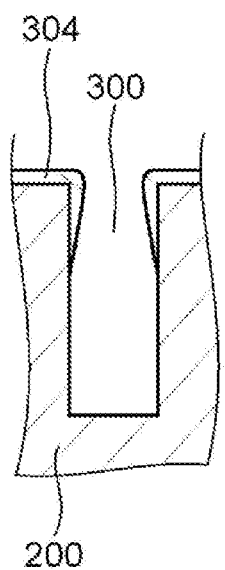
FIG. 8 is a partially-enlarged cross-sectional view showing an example in which a base film 304 is selectively formed in the upper portion in the concave portion 300.

In this step, by supplying a pre-treatment gas to the wafer 200, a base film 304 having a reactivity with a film-forming inhibitor higher than a reactivity between the film-forming inhibitor and the inner surface of a concave portion 300 is selectively (preferentially) formed at least in the upper portion in the concave portion 300, specifically, in the upper portion in the concave portion 300 as shown in FIGS. 6B, 7B, and 8.

For example, in this step, by supplying a precursor gas (+modifying gas) as the pre-treatment gas to the wafer 200 under a condition in which a vapor phase reaction predominates, the base film 304 may be selectively deposited in the upper portion in the concave portion 300 (Method 2-A1). Alternatively, by alternately supplying the precursor gas and the modifying gas as the pre-treatment gas under a condition in which the precursor gas and/or the modifying gas is consumed and/or deactivated in the upper portion in the concave portion 300, the base film 304 may be selectively deposited in the upper portion in the concave portion 300 (Method 2-A2). Alternatively, by supplying the pre-treatment gas under a condition in which a step coverage is deteriorated, to deposit the base film 304 in the concave portion 300, and then supplying an etching gas under a condition in which the base film 304 may be conformally etched, a surface of a portion other than the upper portion in the concave portion 300 may be exposed with the base film 304 left in the upper portion in the concave portion 300 (Method 2-A3). Alternatively, by supplying the modifying gas as the pre-treatment gas under a condition in which the modifying gas is consumed and/or deactivated in the upper portion in the concave portion 300, the surface of the upper portion in the concave portion 300 can be selectively modified to selectively form the base film 304 in the upper portion in the concave portion 300 (Method 2-A4). The material of the base film 304 in these embodiments is the same as that in the above-described embodiments.

When a SiO film is formed as the base film 304, an oxidizing gas may be used as the modifying gas as in the above-described embodiments. As the precursor gas, in addition to the above-mentioned precursor gas, an O-containing precursor gas can be used.

That is, in this case, for example, by supplying the precursor gas (+oxidizing gas) as the pre-treatment gas to the wafer 200 under the condition in which the gas phase reaction predominates, the SiO film may be selectively deposited as the base film 304 in the upper portion in the concave portion 300, as shown in FIGS. 6B, 7B, and 8 (Method 2-A1).

Further, for example, by alternately supplying the precursor gas and the oxidizing gas (modifying gas) as the pre-treatment gas under the condition in which the precursor gas and/or the oxidizing gas is consumed and/or deactivated in the upper portion in the concave portion 300, the SiO film may be selectively deposited as the base film 304 in the upper portion in the concave portion 300, as shown in FIGS. 6B, 7B, and 8 (Method 2-A2).

In this case, purging of the interior of the process chamber 201 with an inert gas may be performed between them. Further, the oxidizing gas may be plasma-excited and supplied. Further, the catalyst gas may be supplied together with at least one selected from the group of the precursor gas and the oxidizing gas. In these cases, the processing temperature may be lowered, whereby and thus a film at the room temperature.

Further, for example, by supplying the pre-treatment gas under a condition in which a step coverage is deteriorated, to deposit the SiO film as the base film 304 in the concave portion 300, as shown in FIG. 9A, and then supplying an etching gas under a condition in which the base film 304 may be conformally etched, the surface of a portion other than the upper portion in the concave portion 300 may be exposed with the SiO film as the base film 304 left in the upper portion in the concave portion 300, as shown in FIGS. 6B, 7B, and 9B (Method 2-A3).

Further, for example, by supplying the oxidizing gas (modifying gas) as the pre-treatment gas under a condition in which the oxidizing gas is consumed and/or deactivated in the upper portion in the concave portion 300, the surface of the upper portion in the concave portion 300 may be selectively oxidized (modified) to selectively form the SiO film as the base film 304 in the upper portion in the concave portion 300, as shown in FIGS. 6B, 7B, and 8 (Method 2-A4).

A method of supplying the precursor gas, the oxidizing gas, the catalyst gas, and the inert gas and a method of purging the interior of the process chamber 201 are the same as those in the above-described embodiments. Further, by applying RF power to the RPU 502 when supplying the oxidizing gas into the process chamber 201, the oxidizing gas may be plasma-excited and supplied.

In this step, a process condition under which the precursor gas (+oxidizing gas) is supplied when the SiO film is formed as the base film 304 according to Method 2-A1 is exemplified as follows.

Processing temperature: 500 to 750 degrees C.
Processing pressure: 1 to 1,000 Pa, specifically 10 to 500 Pa
Precursor gas supply flow rate: 10 to 1,000 sccm, specifically 100 to 500 sccm
Precursor gas supply time: 1 to 60 minutes, specifically 1 to 30 minutes
Oxidizing gas supply flow rate: 0 to 500 sccm, specifically 0 to 300 sccm
Inert gas supply flow rate (for each gas supply pipe): 0 to 20,000 sccm These process conditions may also be said to be process conditions having a strong CVD (Chemical Vapor Deposition) behavior. In this case, as the precursor gas, it may be possible to use, for example, an O-containing precursor gas such as a tetraethoxysilane ($Si(OCH_2CH_3)_4$, abbreviation: TEOS) gas. In this case, the SiO film may be deposited with the O-containing precursor gas alone, but the O-containing precursor gas+oxidizing gas may be also be used to deposit the SiO film. Further, an O-free precursor gas+oxidizing gas may also be used. In this case, as the O-free precursor gas, in addition to the precursor gas according to the above-described embodiments, it may be possible to use a silicon hydride gas such as a monosilane (Sint) gas or a disilane ($Si_2H_6$) gas. The oxidizing gas according to the above-described embodiments may be used as the oxidizing gas.

In this step, process condition under which the precursor gas is supplied when the SiO film is formed as the base film 304 according to Method 2-A2 is exemplified as follows.
Processing temperature: room temperature (25 degrees C.) to 700 degrees C., specifically 200 to 650 degrees C.
Processing pressure: 1 to 2,000 Pa, specifically 5 to 1,000 Pa
Precursor gas supply flow rate: 1 to 3,000 sccm, specifically 1 to 500 sccm
Precursor gas supply time: 1 to 120 seconds, specifically 1 to 60 seconds
Catalyst gas supply flow rate: 0 to 2,000 sccm
Inert gas supply flow rate (for each gas supply pipe): 0 to 20,000 sccm
The same gases as the precursor gas and the catalyst gas in the above-described embodiments may be used as the precursor gas and the catalyst gas, respectively.

In this step, a process condition under which the oxidizing gas is supplied when the SiO film is formed as the base film 304 according to Method 2-A2 is exemplified as follows.
Processing temperature: room temperature (25 degrees C.) to 700 degrees C., specifically 200 to 650 degrees C.
Processing pressure: 1 to 4,000 Pa, specifically 1 to 3,000 Pa
Oxidizing gas supply flow rate: 1 to 10,000 sccm, specifically 100 to 2,000 sccm
Oxidizing gas supply time: 0.1 to 10 seconds, specifically 1 to 10 seconds
Catalyst gas supply flow rate: 0 to 2,000 sccm
Inert gas supply flow rate (for each gas supply pipe): 0 to 20,000 sccm
Radio frequency power (RF power): 0 to 1,500 W
The same gases as the oxidizing gas and the catalyst gas in the above-described embodiments may be used as the oxidizing gas and the catalyst gas, respectively.

In this case, the oxidizing gas may be supplied in a non-plasma atmosphere, or the oxidizing gas may be plasma-excited and supplied. The radio frequency power (RF power): OW means that plasma is not used, that is, non-plasma. When the oxidizing gas is plasma-excited and supplied, the oxidizing gas is supplied under a condition in which O-containing radicals generated by plasma-exciting the oxidizing gas are consumed and/or deactivated in the upper portion in the concave portion 300. Although the process condition under which the oxidizing gas is supplied under the condition in which the oxidizing gas is consumed and/or deactivated in the upper portion in the concave portion 300 is exemplified herein, the precursor gas may be supplied under the conditions in which the precursor gas is consumed and/or deactivated in the upper portion in the concave portion 300.

In this step, according to Method 2-A3, under the condition that step coverage is deteriorated, those in the above-described Method 2-A1 or Method 2-A2 may be used as the pre-treatment gas, the processing method, and the process conditions when forming the SiO film as the base film 304. Further, in Method 2-A3, for example, the precursor gas supply time and the reaction gas supply time may be made longer than the precursor gas supply time and the reaction gas supply time in the above-described Method 2-A1 or Method 2-A2.

In this step, a process condition under which the base film 304 is conformally etched by using a F-containing gas as an etching gas after forming the SiO film as the base film 304 according to Method 2-A3 is exemplified as follows.
Processing temperature: room temperature (25 degrees C.) to 300 degrees C.
Processing pressure: 1 to 1,000 Pa, specifically 10 to 500 Pa
F-containing gas supply flow rate: 10 to 1,000 sccm, specifically 100 to 500 sccm
F-containing gas supply time: 1 to 60 minutes, specifically 1 to 30 minutes
Inert gas supply flow rate (for each gas supply pipe): 0 to 20,000 sccm For example, a HF gas may be used as the F-containing gas In this step, a processing conditions under which the oxidizing gas is supplied when forming the SiO film as the base film 304 according to Method 2-A4 is exemplified as follows.
Processing temperature: 350 to 1,200 degrees C., specifically 400 to 800 degrees C.
Processing pressure: 1 to 4,000 Pa, specifically 1 to 3,000 Pa
Oxidizing gas supply flow rate: 1 to 10,000 sccm, specifically 100 to 2,000 sccm
Oxidizing gas supply time: 0.1 to 60 seconds, specifically 1 to 40 seconds
Inert gas supply flow rate (for each gas supply pipe): 0 to 20,000 sccm
The oxidizing gas in the above-described embodiments may be used as the oxidizing gas.

By performing this step using each of the above-mentioned gases under each of the above-mentioned process conditions according to each of the above-described methods, the SiO film may be selectively (preferentially) formed as the base film 304 in the upper portion in the concave portion 300, as shown in FIGS. 6B, 7B, 8, and 9B.

(Purging)

After the base film 304 is selectively formed in the upper portion in the concave portion 300, purging of the interior of the process chamber 201 is performed in the same manner as the purging in Step A in the above-described embodiments.

[Step B (Formation of Film-Forming Inhibition Layer)]

Figure 7C:
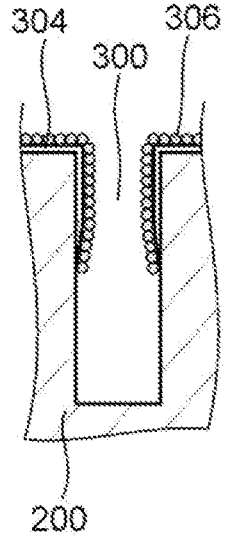
Figure 7D:
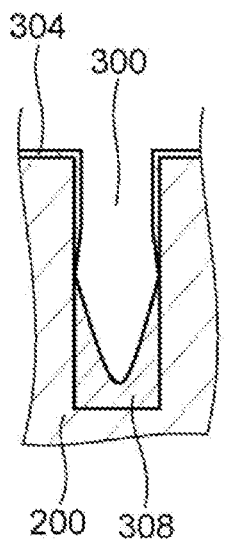
Figure 7E:
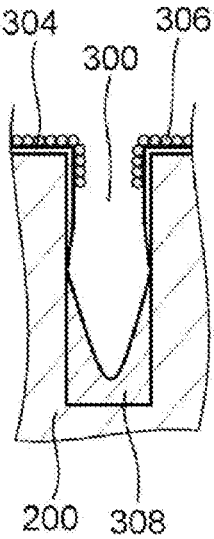
Figure 7F:
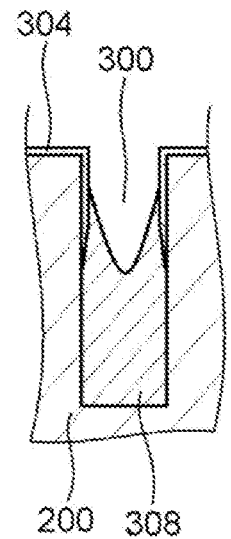
Figure 7G:
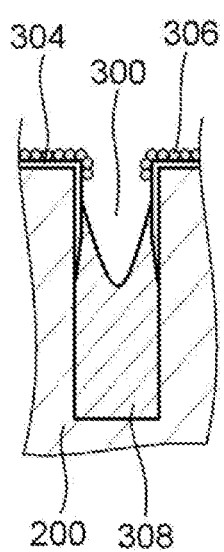
Figure 7H:
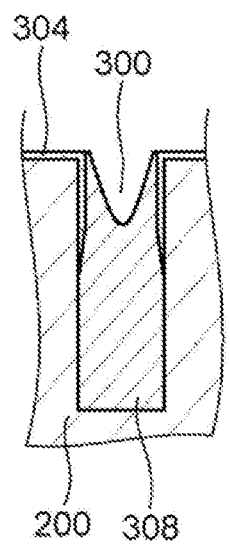
Figure 7I:
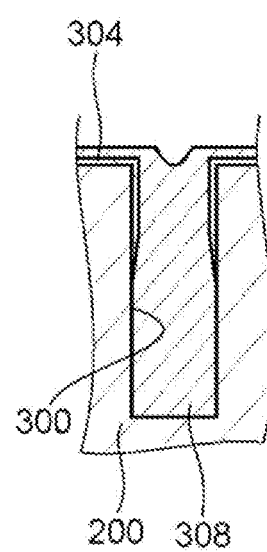

After Step A is completed and the purging of the interior of the process chamber 201 is performed, Step B is performed. In Step B, by supplying a film-forming inhibitor to the wafer 200, the film-forming inhibition layer 306 is formed on the surface of the base film 304 selectively formed in the upper portion in the concave portion 300, as shown in FIGS. 6C and 7C. As a result, the film-forming inhibition layer 306 is formed on the portion of the base film 304, which is formed in the upper portion in the concave portion 300.

For example, by supplying a F-containing gas as the film-forming inhibitor, F-containing radicals may be generated and a F-terminated layer may be formed as the film-forming inhibition layer 306 on the entire surface of the base film 304 selectively formed in the upper portion in the concave portion 300 by the action of the generated F-containing radicals. As a result, the F-terminated layer as the film-forming inhibition layer 306 is formed on the portion of the base film 304, which is formed in the upper portion in the concave portion 300 (Method 2-B1).

Further, for example, by supplying a Si-containing gas and a F-containing gas as the film-forming inhibitor in this order, a F-terminated layer may be formed as the film-forming inhibition layer 306 on the entire surface of the base film 304 selectively formed in the upper portion in the concave portion 300 (Method 2-B2).

In this case, the interior of the process chamber 201 may be purged with an inert gas after supplying the Si-containing gas and before supplying the F-containing gas. In the case of Method 2-B2, by supplying the Si-containing gas, the Si-containing gas may be chemically adsorbed on the entire surface of the base film 304 formed in the upper portion in the concave portion 300. Thereafter, by supplying the F-containing gas, the Si-containing gas adsorbed on the entire surface of the base film 304 is reacted with the F-containing gas to generate F-containing radicals, and the F-terminated layer may be formed as the film-forming inhibition layer 306 on the entire surface of the base film 304 by the action of the generated F-containing radicals. In this case, by supplying the Si-containing gas under a condition in which the chemical adsorption of the Si-containing gas on the surface of the base film 304 is saturated, that is, under a condition in which a self-limit occurs in the chemical adsorption of the Si-containing gas on the surface of the base film 304, a chemically-adsorbed layer of Si-containing gas may be uniformly formed over the entire surface of the base film 304. Thereafter, by supplying the F-containing gas, the F-containing radicals may be uniformly generated over the entire surface of the base film 304, which makes it possible to form the F-terminated layer as the film-forming inhibition layer 306 uniformly over the entire surface of the base film 304. Even in this case, as a result, the hydrocarbon group-terminated layer as the film-forming inhibition layer 306 is formed on a portion of the base film 304, which is formed in the upper portion in the concave portion 300. As the Si-containing gas, an aminosilane-based gas may be used in terms of adsorption on the surface of the base film 304 in some embodiments.

Further, for example, by supplying a hydrocarbon group-containing gas as the film-forming inhibitor, the hydrocarbon group-containing gas may be chemically adsorbed on the entire surface of the base film 304 selectively formed in the upper portion in the concave portion 300, so that a hydrocarbon group-terminated layer may be formed as the film-forming inhibition layer 306 (Method 2-B3).

In this case, by supplying the hydrocarbon group-containing gas under a condition in which the chemical adsorption of the hydrocarbon group-containing gas on the surface of the base film 304 is saturated, that is, under a condition in which a self-limit occurs in the chemical adsorption of the hydrocarbon group-containing gas on the surface of the base film 304, a chemically-adsorbed layer of the hydrocarbon group-containing gas may be uniformly formed over the entire surface of the base film 304. Even in this case, as a result, the hydrocarbon group-terminated layer as the film-forming inhibition layer 306 is formed on a portion of the base film 304, which is formed in the upper portion in the concave portion 300.

A method of supplying the F-containing gas, the hydrocarbon group-containing gas, and the inert gas and a method of purging the interior of the process chamber 201 are the same as those in the above-described embodiments.

When the Si-containing gas is used, the valve 243*d* is opened to allow the Si-containing gas to be supplied into the gas supply pipe 232*d*. A flow rate of the Si-containing gas is regulated by the MFC 241*d*, and the Si-containing gas is supplied into the process chamber 201 via the nozzle 249*a* and is exhausted via the exhaust port 231*a*. In this operation, the Si-containing gas is supplied to the wafer 200. At this time, the valves 243*e* to 243*g* may be opened to allow an inert gas to be supplied into the process chamber 201 via the nozzles 249*a* to 249*c*, respectively.

In this step, a process condition under which the F-containing gas is supplied according to Method 2-B1 is exemplified as follows.

Processing temperature: 200 degrees C. to 600 degrees C., specifically 350 to 500 degrees C.

Processing pressure: 1 to 2,000 Pa, specifically 1 to 1,000 Pa

F-containing gas supply flow rate: 100 to 3,000 sccm, specifically 100 to 500 sccm F-containing gas supply time: 1 to 120 seconds, specifically 1 to 60 seconds Inert gas supply flow rate (for each gas supply pipe): 0 to 20,000 sccm The same gas as the F-containing gas in the above-described embodiments may be used as the F-containing gas.

In this step, a process condition under which the Si-containing gas is supplied according to Method 2-B2 is exemplified as follows.

Processing temperature: room temperature (25 degrees C.) to 600 degrees C., specifically room temperature to 450 degrees C.

Processing pressure: 1 to 2,000 Pa, specifically 1 to 1,000 Pa

Si-containing gas supply flow rate: 1 to 2,000 sccm, specifically 1 to 500 sccm

Si-containing gas supply time: 1 second to 60 minutes

Inert gas supply flow rate (for each gas supply pipe): 0 to 10,000 sccm

The precursor gas in the above-described embodiments may be used as the Si-containing gas. As the Si-containing gas, for example, an aminosilane-based gas may be used.

In this step, a process conditions under which the F-containing gas is supplied according to Method 2-B2 is exemplified as follows.

Processing temperature: room temperature (25 degrees C.) to 450 degrees C., specifically 75 to 450 degrees C.

Processing pressure: 1 to 2,000 Pa, specifically 1 to 1,000 Pa

F-containing gas supply flow rate: 1 to 2,000 sccm, specifically 1 to 500 sccm

F-containing gas supply time: 1 second to 60 minutes

Inert gas supply flow rate (for each gas supply pipe): 0 to 10,000 sccm

The same gas as the F-containing gas in the above-described embodiments may be used as the F-containing gas.

In this step, a process condition under which the hydrocarbon group-containing gas is supplied according to Method 2-B3 is exemplified as follows.

Processing temperature: room temperature (25 degrees C.) to 500 degrees C., specifically room temperature to 250 degrees C.

Processing pressure: 5 to 1,000 Pa

Hydrocarbon group-containing gas supply flow rate: 100 to 3,000 sccm, specifically 100 to 500 sccm Hydrocarbon group-containing gas supply time: 1 second to 120 minutes, specifically 30 second to 60 minutes Inert gas supply flow rate (for each gas supply pipe): 0 to 20,000 sccm The same gas as the hydrocarbon group-containing gas in the above-described embodiments may be used as the hydrocarbon group-containing gas.

By performing this step under each of the above-mentioned process conditions by using each of the above-mentioned gases by each of the above-described methods, the film-forming inhibition layer 306 may be formed on the surface of the base film 304 selectively formed in the upper portion in the concave portion 300, as shown in FIGS. 6C and 7C.

(Purging)

After the film-forming inhibition layer 306 is formed on the surface of the base film 304 selectively formed in the upper portion in the concave portion 300, purging of the interior of the process chamber 201 is performed in the same manner as the purging in Step B in the above-described embodiments.

[Step C (Selective Growth, Bottom-up Growth)]

Step C in these embodiments may be performed in the same manner as Step C in the above-described embodiments. As a result, as shown in FIGS. 6D to 6G and 7D to 7I, it is possible to bottom-up grow, for example, a SiN film or SiON film as the film 308 upward from the bottom in the concave portion 300. However, in the above-described embodiments, the film 308 is formed on the base film 304 formed in the entire concave portion 300, whereas in these embodiments, the film 308 is formed on the surface of the concave portion 300 in the central portion and the lower portion in the concave portion 300, and the film 308 is formed on the surface of the base film 304 formed in the concave portion 300 in the upper portion of the concave portion 300.

The formation of the film-forming inhibition layer 306 to be removed at the final stage of the film formation, the formation of the film-forming inhibition layer 306 to be invalidated at the final stage of the film formation, the removal of the film-forming inhibition layer 306 at the final stage of the film formation, and the invalidation of the film-forming inhibition layer 306 at the final stage of the film formation, and the like may be performed in the same manner as in the above-described embodiments. Further, the repair of the film-forming inhibition layer 306, the re-formation of the film-forming inhibition layer 306, the repair of the base film 304, the re-formation of the base film 304, and each processing sequence when performing them may be performed in the same manner as those in the above-described embodiments.

According to these embodiments, the same effects as those of the above-described embodiments may be obtained. Further, according to these embodiments, in Step A, by selectively forming the base film 304 in the upper portion in the concave portion 300 formed on the surface of the wafer 200, it is possible to selectively and efficiently form an appropriate film-forming inhibition layer having a high density and a high film-forming inhibition effect on the portion of the base film 304, which is formed in the upper portion in the concave portion 300, thereby improving the burial characteristics. This enables seamless and void-free gap fill.

Other Embodiments of the Present Disclosure

The embodiments of the present disclosure have been specifically described above. However, the present disclosure is not limited to the above-described embodiments, but may be changed in various ways without departing from the gist thereof.

For example, the base film 304 formed in Step A may be made of any material having a reactivity with a film-forming inhibitor higher than a reactivity between the film-forming inhibitor and the inner surface of the concave portion 300 and being capable of having the film forming inhibition layer formed on the surface thereof. For example, as the base film 304, in addition to the above-mentioned SiO film, it may be possible to use, for example, a SiOCN film, a SiON film, a SiOC film, a SiN film, or the like. Even in this case, the effects of the same tendency as the above-described embodiments may be obtained. However, as described above, as the base film 304, it is preferable to use the O-containing film or the oxide film, specifically the Si- and O-containing film, or more specifically the SiO film.

Further, for example, in Step C, not only the silicon-based insulating film such as the SiN film or the SiON film but also a silicon-based insulating film such as a SiCN, a SiOC film, a SiON film, a SiOCN film, or a SiO film may be formed. Further, for example, a metal-based oxide film such as an aluminum oxide film (AlO film), a titanium oxide film (TiO film), a hafnium oxide film (HfO film), a zirconium oxide film (ZrO film), a tantalum oxide film (TaO film), a molybdenum oxide film (MoO film), or a tungsten oxide film (WO film), or a metal-based nitride film such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN film), or a tungsten nitride film (WN film) may be formed. In these cases, as the above-mentioned pre-treatment gas, the above-mentioned film-forming inhibitor, the above-mentioned reaction gas, and the precursor gas, a precursor gas containing metal elements such as Al, Ti, Hf, Zr, Ta, Mo, and W may be used to perform Steps A to C according to the same processing procedure and process conditions as those in the above-described embodiments. Even in these cases, the same effects as in the above-described embodiments may be obtained.

Recipes used in each process may be provided individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

Examples in which a film is formed by using a batch-type substrate processing apparatus capable of processing a plurality of substrates at a time have been described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, examples in which a film is formed by using a substrate processing apparatus provided with a hot-wall-type process furnace have been described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, each process may be performed according to the same processing procedures and process conditions as those in the above-described embodiments, and the same effects as in the above-described embodiments may be achieved.

The above-described embodiments may be used in proper combination. The processing procedures and process conditions used in this case may be the same as, for example, the processing procedures and process conditions in the above-described embodiments.

The process conditions in each step in the above-described embodiments are merely examples, but may be regulated as appropriate depending on a depth of a concave portion such as a trench or a hole formed on the surface of a substrate.

According to the present disclosure in some embodiments, it is possible to provide a technique that improves burial characteristics when burying an interior of a concave portion with a film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) forming a base film, which has a reactivity with a film-forming inhibitor higher than a reactivity between the film-forming inhibitor and an inner surface of a concave portion formed on a surface of the substrate, at least in an upper portion in the concave portion by supplying a pre-treatment gas to the substrate;
   (b) forming a film-forming inhibition layer on a portion of a surface of the base film, which is formed in the upper portion in the concave portion, by supplying the film-forming inhibitor to the substrate; and
   (c) growing a film starting from a portion in the concave portion where the film-forming inhibition layer is not formed, by supplying a film-forming gas to the substrate,
   wherein the base film is made of a first material and the film is made of a second material that is different from the first material.

2. The method of claim 1, wherein in (a), an oxygen-containing film is formed as the base film.

3. The method of claim 1, wherein in (a), a silicon- and oxygen-containing film is formed as the base film.

4. The method of claim 1, wherein in (a), a silicon oxide film is formed as the base film.

5. The method of claim 1, wherein in (a), the base film is selectively formed in the upper portion in the concave portion.

6. The method of claim 5, wherein in (a), the base film is selectively deposited in the upper portion in the concave portion by supplying a precursor gas as the pre-treatment gas under a condition in which a gas phase reaction is predominant.

7. The method of claim 5, wherein in (a), the base film is selectively deposited in the upper portion in the concave portion by alternately supplying a precursor gas and a modifying gas as the pre-treatment gas under a condition in which at least one selected from the group of consumption and deactivation of at least one selected from the group of the precursor gas and the modifying gas occurs in the upper portion in the concave portion.

8. The method of claim 5, wherein in (a), a surface of a portion other than the upper portion in the concave portion is exposed with the base film left in the upper portion in the concave portion by supplying the pre-treatment gas, under a condition in which step coverage is deteriorated, to deposit the base film in the concave portion and then supplying an etching gas under a condition in which the base film is conformally etchable.

9. The method of claim 5, wherein in (a), a surface of the upper portion in the concave portion is selectively modified to selectively form the base film in the upper portion in the concave portion by supplying a modifying gas as the pre-treatment gas under a condition in which at least one selected from the group of consumption and deactivation of the modifying gas occurs in the upper portion in the concave portion.

10. The method of claim 1, wherein in (b), a fluorine-terminated layer is formed as the film-forming inhibition layer by supplying a fluorine-containing gas as the film-forming inhibitor.

11. The method of claim 1, wherein in (b), a hydrocarbon group-terminated layer is formed as the film-forming inhibition layer by supplying a hydrocarbon group-containing gas as the film-forming inhibitor.

12. The method of claim 1, wherein in (a), the base film is formed entirely in the concave portion.

13. The method of claim 12, wherein in (a), the base film is formed in the concave portion by alternately supplying a precursor gas and a modifying gas as the pre-treatment gas to deposit the base film in the concave portion or by supplying the modifying gas as the pre-treatment gas to modify the inner surface of the concave portion.

14. The method of claim 12, wherein in (b), the film-forming inhibition layer is selectively formed on a portion of the surface of the base film, which is formed in the upper portion in the concave portion.

15. The method of claim 14, wherein in (b), the film-forming inhibitor is supplied under a condition in which at least one selected from the group of consumption and deactivation of the film-forming inhibitor occurs in the upper portion in the concave portion.

16. The method of claim 14, wherein in (b), a fluorine-terminated layer is formed as the film-forming inhibition layer by supplying a fluorine-containing gas as the film-forming inhibitor.

17. The method of claim 14, wherein in (b), a fluorine-terminated layer is formed as the film-forming inhibition layer by supplying a fluorine-containing gas as the film-forming inhibitor under a condition in which the fluorine-containing gas is thermally decomposed.

18. The method of claim 14, wherein in (b), a fluorine-terminated layer is formed as the film-forming inhibition layer by plasma-exciting and supplying a fluorine-containing gas as the film-forming inhibitor.

19. The method of claim 14, wherein in (b), a fluorine-terminated layer is formed as the film-forming inhibition layer by supplying a fluorine-containing gas and an additive gas reacting with the fluorine-containing gas as the film-forming inhibitor.

20. The method of claim 14, wherein in (b), a hydrocarbon group-terminated layer is formed as the film-forming inhibition layer by supplying a hydrocarbon group-containing gas as the film-forming inhibitor.

21. The method of claim 1, wherein before the film grows to the upper portion in the concave portion in (c), the film-forming inhibition layer for which at least one selected from the group of removal and invalidation is performed by an action of the film-forming gas is formed in (b).

22. A method of manufacturing a semiconductor device, comprising:
(a) forming a base film, which has a reactivity with a film-forming inhibitor higher than a reactivity between the film-forming inhibitor and an inner surface of a concave portion formed on a surface of a substrate, at least in an upper portion in the concave portion by supplying a pre-treatment gas to the substrate;
(b) forming a film-forming inhibition layer on a portion of a surface of the base film, which is formed in the upper portion in the concave portion, by supplying the film-forming inhibitor to the substrate; and
(c) growing a film starting from a portion in the concave portion where the film-forming inhibition layer is not formed, by supplying a film-forming gas to the substrate,
wherein the base film is made of a first material and the film is made of a second material that is different from the first material.

* * * * *